US012751074B2

(12) United States Patent
Han et al.

(10) Patent No.: US 12,751,074 B2
(45) Date of Patent: Sep. 29, 2026

(54) SOURCE AND DRAIN REGIONS FOR LATERALLY ADJACENT GATE-ALL-AROUND (GAA) PMOS AND NMOS

(71) Applicant: INTEL CORPORATION, Santa Clara, CA (US)

(72) Inventors: Chang Wan Han, Portland, OR (US); Biswajeet Guha, Hillsboro, OR (US); Vivek Thirtha, Portland, OR (US); William Hsu, Portland, OR (US); Ian Yang, Portland, OR (US); Oleg Golonzka, Beaverton, OR (US); Kevin J. Fischer, Hillsboro, OR (US); Suman Dasgupta, Beaverton, OR (US); Sameerah Desnavi, Hillsboro, OR (US); Deepak Sridhar, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 122 days.

(21) Appl. No.: 17/896,813

(22) Filed: Aug. 26, 2022

(65) Prior Publication Data

US 2024/0071831 A1 Feb. 29, 2024

(51) Int. Cl.

| | |
|---|---|
| ***H10D 84/01*** | (2026.01) |
| ***H10D 30/01*** | (2025.01) |
| ***H10D 30/43*** | (2025.01) |
| ***H10D 30/47*** | (2025.01) |

(Continued)

(52) U.S. Cl.

CPC ......... *H10D 84/017* (2025.01); *H10D 30/014* (2025.01); *H10D 30/43* (2025.01);

(Continued)

(58) Field of Classification Search

CPC .... H10D 84/017; H10D 30/014; H10D 30/43; H10D 30/47; H10D 30/6729; H10D 30/6735; H10D 30/6757; H10D 62/121; H10D 62/151; H10D 64/258; H10D 84/0167; H10D 84/0186; H10D 84/038;

(Continued)

(56) References Cited

U.S. PATENT DOCUMENTS

2017/0365604 A1* 12/2017 Suh ........................ H10D 84/85
2018/0197861 A1* 7/2018 Park ................... H10D 84/0193

(Continued)

*Primary Examiner* — Yara B Green
*Assistant Examiner* — Fakeha Sehar
(74) *Attorney, Agent, or Firm* — Arcane Law PLLC

(57) ABSTRACT

An integrated circuit includes laterally adjacent first and second devices. The first device includes a first source or drain region, a first gate structure, and a first inner spacer between the first source or drain region and the first gate structure. The second device includes a second source or drain region, a second gate structure, and a second inner spacer between the second source or drain region and the second gate structure. In an example, the first source or drain region has a width that is at least 1 nanometer different from a width of the second source or drain region, and/or the first inner spacer has a width that is at least 1 nanometer different from a width of the second inner spacer. The various widths are measured in a direction of a semiconductor body between the first source or drain region and the first gate structure.

23 Claims, 25 Drawing Sheets

(51) Int. Cl.

| | |
|---|---|
| ***H10D 30/67*** | (2025.01) |
| ***H10D 62/10*** | (2025.01) |
| ***H10D 62/13*** | (2025.01) |
| ***H10D 64/23*** | (2025.01) |
| ***H10D 84/03*** | (2025.01) |
| ***H10D 84/85*** | (2025.01) |

(52) U.S. Cl.

CPC ......... *H10D 30/47* (2025.01); *H10D 30/6729* (2025.01); *H10D 30/6735* (2025.01); *H10D 30/6757* (2025.01); *H10D 62/121* (2025.01); *H10D 62/151* (2025.01); *H10D 64/258* (2025.01); *H10D 84/0167* (2025.01); *H10D 84/0186* (2025.01); *H10D 84/038* (2025.01); *H10D 84/85* (2025.01)

(58) Field of Classification Search

CPC ... H10D 84/85; H10D 64/017; H10D 84/0184

See application file for complete search history.

(56) References Cited

U.S. PATENT DOCUMENTS

| | | | | |
|---|---|---|---|---|
| 2021/0328009 | A1* | 10/2021 | Singh | H10D 62/115 |
| 2021/0391477 | A1* | 12/2021 | Chang | H10D 30/797 |
| 2022/0102199 | A1* | 3/2022 | Hsiung | H01L 21/76897 |
| 2022/0230925 | A1* | 7/2022 | More | H10D 84/038 |
| 2022/0328641 | A1* | 10/2022 | Liaw | H10D 30/014 |
| 2023/0187270 | A1* | 6/2023 | Hsiung | H10D 30/6757 257/347 |
| 2023/0411392 | A1* | 12/2023 | Zhou | H10D 62/118 |

* cited by examiner

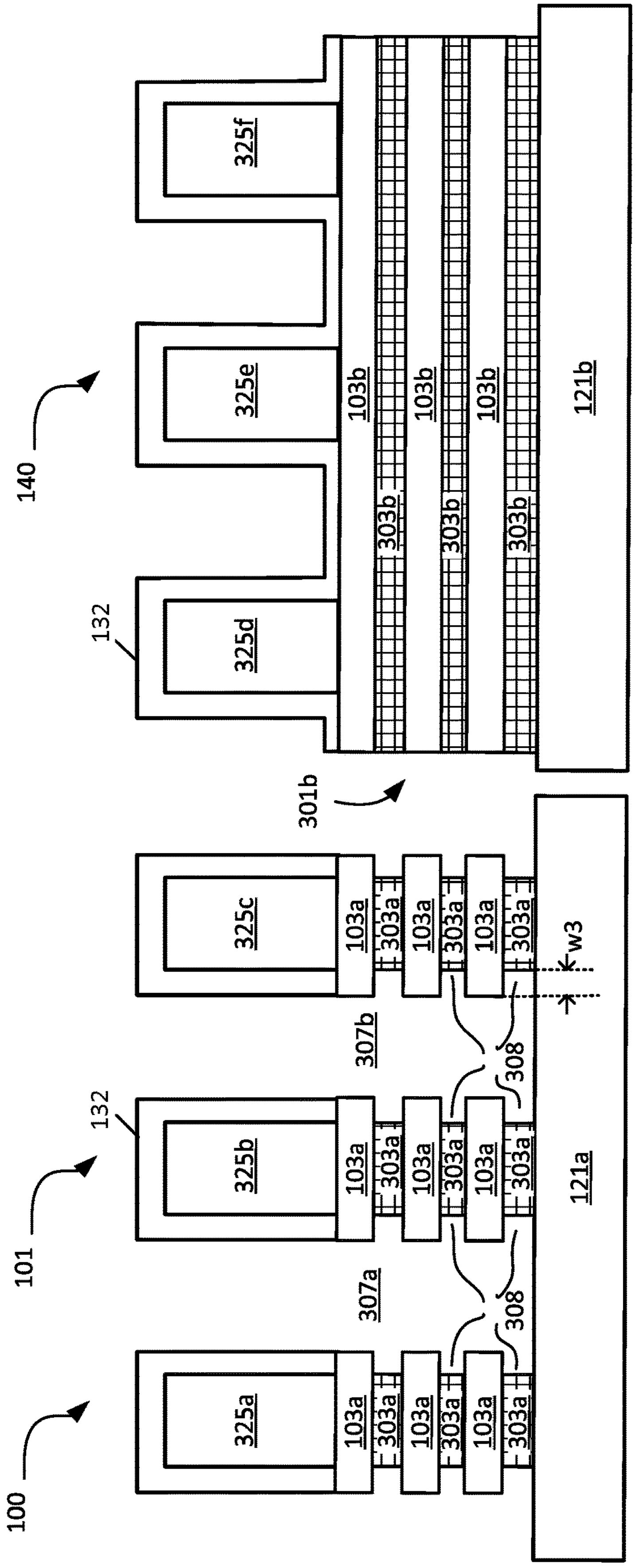
FIG. 3D1

SOURCE AND DRAIN REGIONS FOR LATERALLY ADJACENT GATE-ALL-AROUND (GAA) PMOS AND NMOS

FIELD OF THE DISCLOSURE

The present disclosure relates to integrated circuits, and more particularly, to processes for formation of source and drain regions in laterally adjacent devices.

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device; and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A gate-all-around (GAA) transistor (sometimes referred to as a nanoribbon or nanowire transistor) is configured similarly to a fin-based transistor, but instead of a finned channel region, one or more channel bodies such as nanoribbons or nanowires extend between the source and the drain regions. In GAA transistors, the gate material wraps around each nanoribbon (hence, gate-all-around). There are various non-trivial issues associated with formation of GAA transistor devices.

BRIEF DESCRIPTION OF THE DRAWINGS

FIGS. 3A, 3B, 3C, 3D, 3D1, 3E, 3F, 3G, 3H, 3I, 3J, 3K, 3L, 3M, 3N, 3O, 3P, 3Q, and 3R collectively illustrate cross-sectional views of an example semiconductor structure (e.g., the semiconductor structures of FIGS. 1A-1B) in various stages of processing, in accordance with an embodiment of the present disclosure.

Figure 1A:
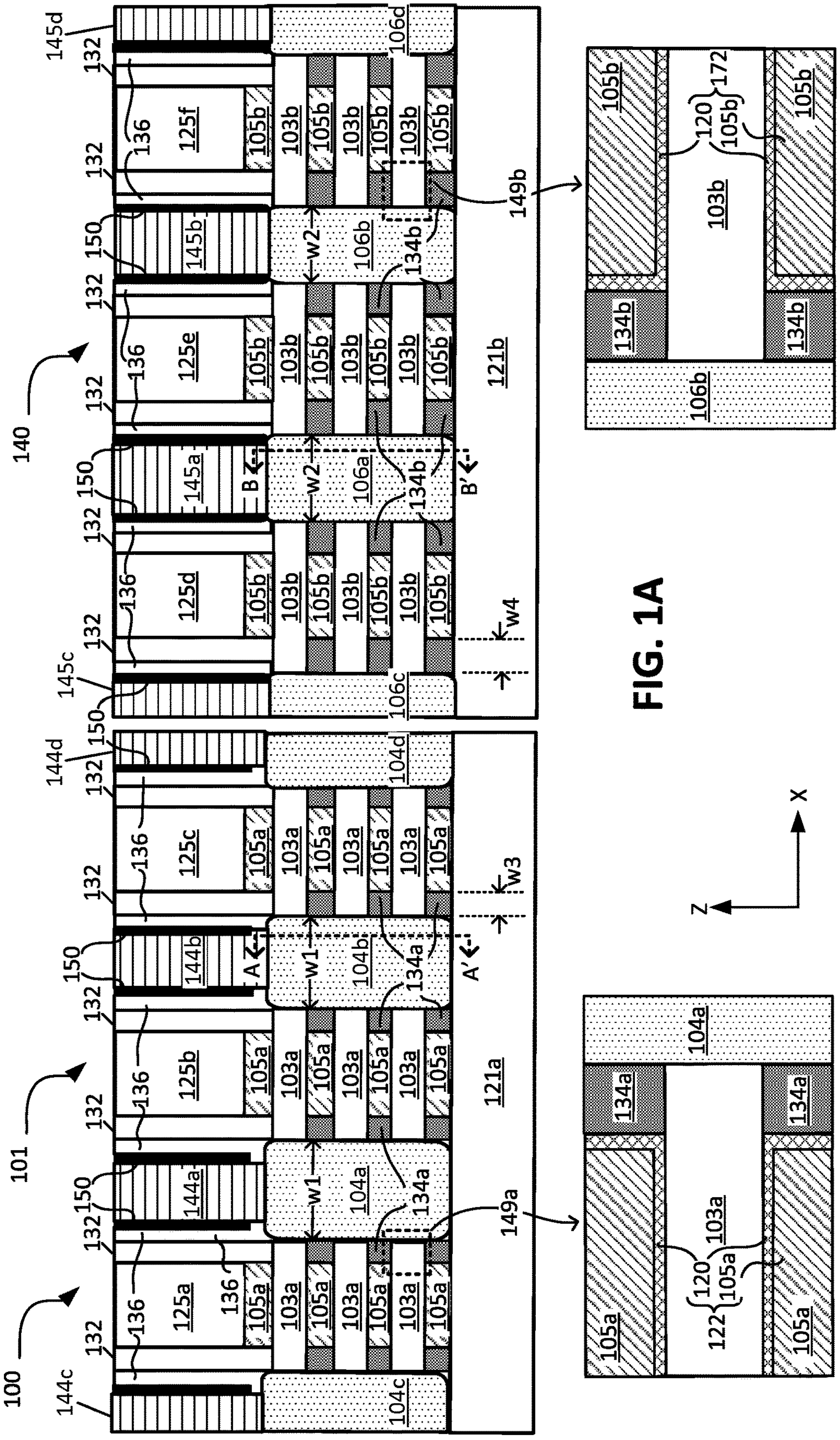
FIG. 1A illustrates a cross-section view of an integrated circuit structure including a left device and a right device, wherein the left device comprises (i) a left source region, (ii) a left drain region, (iii) a plurality of left inner spacers, each left inner spacer adjacent to a corresponding one of the left source or drain regions, wherein the right device comprises (i) a right source region, (ii) a right drain region, (iii) a plurality of right inner spacers, each right inner spacer adjacent to a corresponding one of the right source or drain regions, wherein (A) a width w1 of at least one of the left source or drain regions is at least 1 nm different from a width w2 of at least one of the right source or drain regions, and/or (B) a width w3 of at least one of the plurality of left inner spacers is at least 1 nm different from a width w4 of at least one of the plurality of right inner spacers, wherein the widths are measured in a lateral direction parallel to a length of a channel region (e.g., comprising nanoribbons) of the left or right devices, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Techniques are provided herein to form an integrated circuit comprising a first device laterally adjacent to a second device, where the first device is one of a p-channel metal-oxide semiconductor (PMOS) device or a n-channel metal-oxide semiconductor (NMOS) device, and the second device is the other of the PMOS device or the NMOS device. For example, first inner spacers, a first source region, and a first drain region of the first device are formed, followed by formation of second inner spacers, a second source region, and a second drain region of the second device. For example, when the first inner spacers, the first source region, and the first drain region of the first device are being formed, the second device is protected (e.g., masked) by a mask. After formation of the first inner spacers, the first source region, and the first drain region of the first device is complete, the second inner spacers, the second source region, and the second drain region of the second device are formed, while now the first device is protected by a layer of dielectric material (note that the layer of dielectric material may not, or may, be later removed). Masking the second device while forming the above discussed components of first device, and similarly, protecting the first device (e.g., using the layer of dielectric material) while forming the above discussed components of second device ensures, for example, that exposed tip or end regions of the channel materials (e.g., which are exposed through the source or drain trenches) are not contaminated by any foreign material, as will be discussed in further detail herein below.

In one embodiment, an integrated circuit structure comprises a first device laterally adjacent to a second device. The first device comprises (i) a first source or drain region, (ii) a first body comprising semiconductor material laterally extending from the first source or drain region, (iii) a first gate structure wrapping around a section of the first body, and (v) a first inner spacer between the first source or drain region and the first gate structure. The second device comprises (i) a second source or drain region, (ii) a second body comprising semiconductor material laterally extending from the second source or drain region, (iii) a second gate structure wrapping around a section of the second body, and (v) a second inner spacer between the second source or drain region and the second gate structure. The first source or drain region has a first width in a direction parallel to the first body, the second source or drain region has a second width in the direction parallel to the first body, the first inner spacer has a third width in the direction parallel to the first body, and the second inner spacer has a fourth width in the direction parallel to the first body. In an example, the first width is different from the second width by at least 1 nm. Additionally, or alternatively, the third width is different from the fourth with by at least 1 nm. In an example, the first device is one of a PMOS device or an NMOS device, and the second device is the other of the PMOS device or the NMOS device. For example, the first device and the second device are arranged in a complementary metal oxide semiconductor (CMOS) architecture.

In another embodiment, an integrated circuit structure comprises a first device laterally adjacent to a second device. The first device comprises (i) a first source or drain region and a corresponding first source or drain contact, (ii) a first gate structure and a corresponding first gate contact, (iii) a first layer comprising a first dielectric material and an adjacent second layer comprising a second dielectric material, wherein the first layer and the second layer are laterally between the first gate contact and the first source or drain contact, and (iv) a first inner spacer laterally between the first source or drain region and the first gate structure. In an example, the second device comprises (i) a second source or drain region and a corresponding second source or drain contact, (ii) a second gate structure and a corresponding second gate contact, (iii) a third layer comprising the first dielectric material and an adjacent fourth layer comprising the second dielectric material, wherein the third layer and the fourth layer are laterally between the second gate contact and the second source or drain contact, and (iv) a second inner spacer laterally between the second source or drain region and the second gate structure. In an example, the first inner spacer is below the first layer and not below the second layer. In an example, the second inner spacer is below the fourth layer. In an example, the second inner spacer is also below the third layer. In an example, a first interface is between the first and second layers, and a second interface is between the third and fourth layers.

In yet another embodiment, a method of forming laterally adjacent first and second devices includes forming laterally adjacent first fin and second fin. Each of the first and second fins comprises alternate layers of channel materials and sacrificial materials. In an example, the method further comprises patterning the first fin, to form a first source or drain trench adjacent to the first fin, while protecting a laterally adjacent second fin using a mask and refraining from forming any source or drain trench adjacent to the second fin. In an example, the method further comprises recessing end portion of the sacrificial materials of the first fin through the first source or drain trench, and forming a first inner spacer adjacent the first fin. In an example, the method further comprises forming a first source or drain region within the first source or drain trench. In an example, the method further comprises subsequent to forming the first source or drain region, patterning the second fin, to form a second source or drain trench adjacent to the second fin. In an example, the method further comprises recessing end portion of the sacrificial materials of the second fin through the second source or drain trench, and forming a second inner spacer adjacent the second fin. In an example, the method further comprises forming a second source or drain region within the second source or drain trench. Numerous configurations and variations will be apparent in light of this disclosure.

General Overview

As mentioned herein above, there are various non-trivial issues associated with formation of GAA transistor devices. For example, assume a first device laterally adjacent to a second device, where the first device is one of a PMOS GAA device or an NMOS GAA device, and the second device is the other of the PMOS GAA device or the NMOS GAA device. In an example, to form the source and drain regions of the two devices, fins of both devices are selectively recessed, e.g., to form source and drain trenches for both devices. Subsequently, inner spacers are formed adjacent to the source and drain trenches, such that tips of channel materials are exposed through the inner spacers. Note that in an example, the PMOS device source and drain regions may be compositionally different from the NMOS device source and drain regions. To prevent PMOS source and drain region epitaxial growth on a NMOS device and/or to prevent NMOS source and drain region epitaxial growth on a PMOS device, after formation of the inner spacers in the laterally adjacent NMOS and PMOS devices, a layer or film comprising dielectric material is deposited within the source or drain trenches of both devices. Note that the film comprising dielectric material is in contact with the tips of channel materials (e.g., which will later be released to form the nanoribbons) of both devices. Subsequently, the thin film of one of the two devices (e.g., the first device) is removed and the epitaxial source and drain regions of the first device are formed. Subsequently, the thin film of the other of the two devices (e.g., the second device) is removed and the epitaxial source and drain regions of the second device are formed. This way, PMOS source and drain regions cannot grow on the NMOS device, and NMOS source and drain regions cannot grow on the PMOS device. However, even though the film comprising dielectric material is removed, residues or remnants of the film may remain on the tips of the nanoribbons (e.g., channel regions) of the two devices.

Accordingly, techniques are provided herein to form an IC that includes a first device laterally adjacent to a second device, where first inner spacers, a first source region, and a first drain region of the first device are initially formed, followed by formation of second inner spacers, a second source region, and a second drain region of the second device. In an example, the first device is one of a PMOS GAA device or an NMOS GAA device, and the second device is the other of the PMOS GAA device or the NMOS GAA device. Note that an example of the channel region in a GAA device includes nanoribbons. As will be appreciated in light of this disclosure, reference to nanoribbons as channel regions is also intended to include other gate-all-around or multi-gate channel regions, such as nanowires, nanosheets, and other such semiconductor bodies around which a gate structure can wrap. To this end, the use of a specific channel region configuration (e.g., nanoribbon) is not intended to limit the present description to that specific channel configuration. Rather, the techniques provided herein can benefit any number of channel configurations, whether those bodies be nanowires, nanoribbons, nanosheets or some other body around which a gate structure can at least partially wrap (such as the semiconductor bodies of a forksheet device or a fin-based device).

Continuing with the above discussion regarding formation of the laterally adjacent first and second devices, initially two adjacent fins are formed, a left fin for forming a left device and a right fin for forming a right device. Each of the fins comprise alternating layers of sacrificial material and channel material. One or more dummy gates are formed above each of the left and right fins, and a first layer comprising dielectric material are deposited above the resultant structure (see FIG. 3A).

Figure 3A:
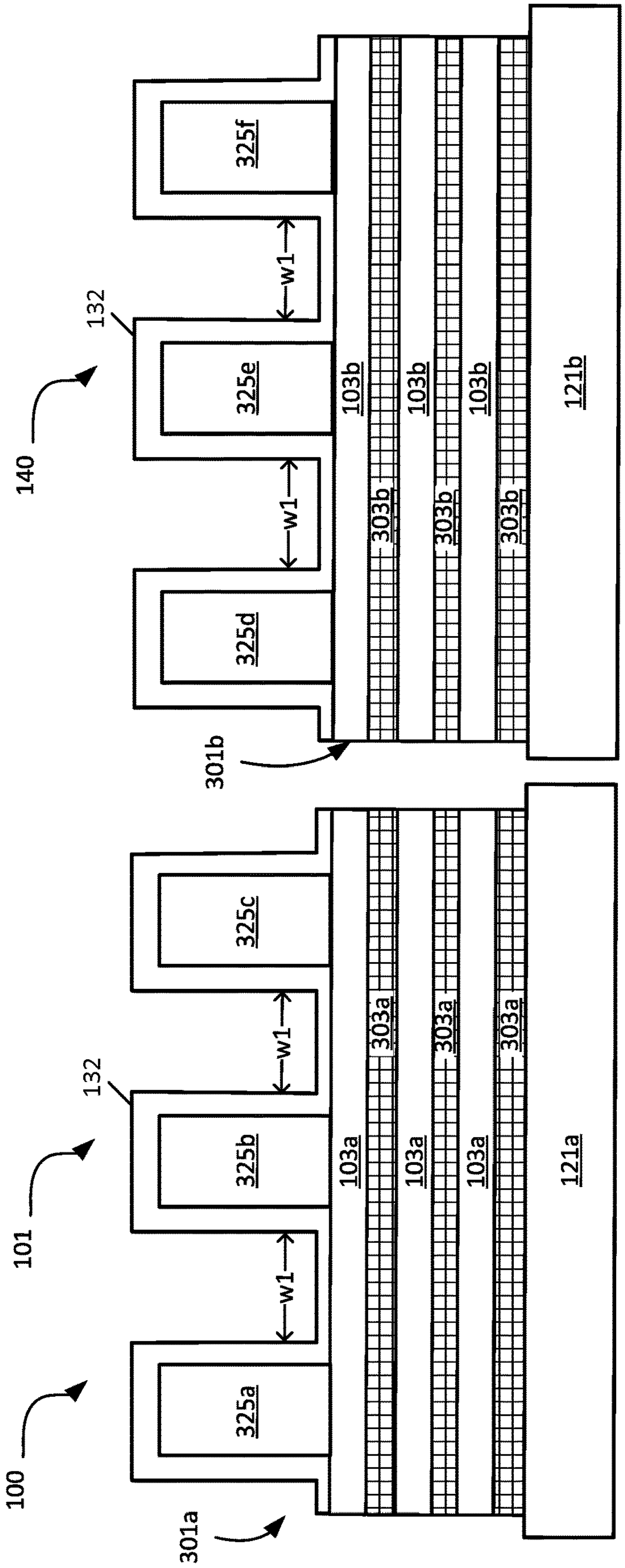
Figure 3B:
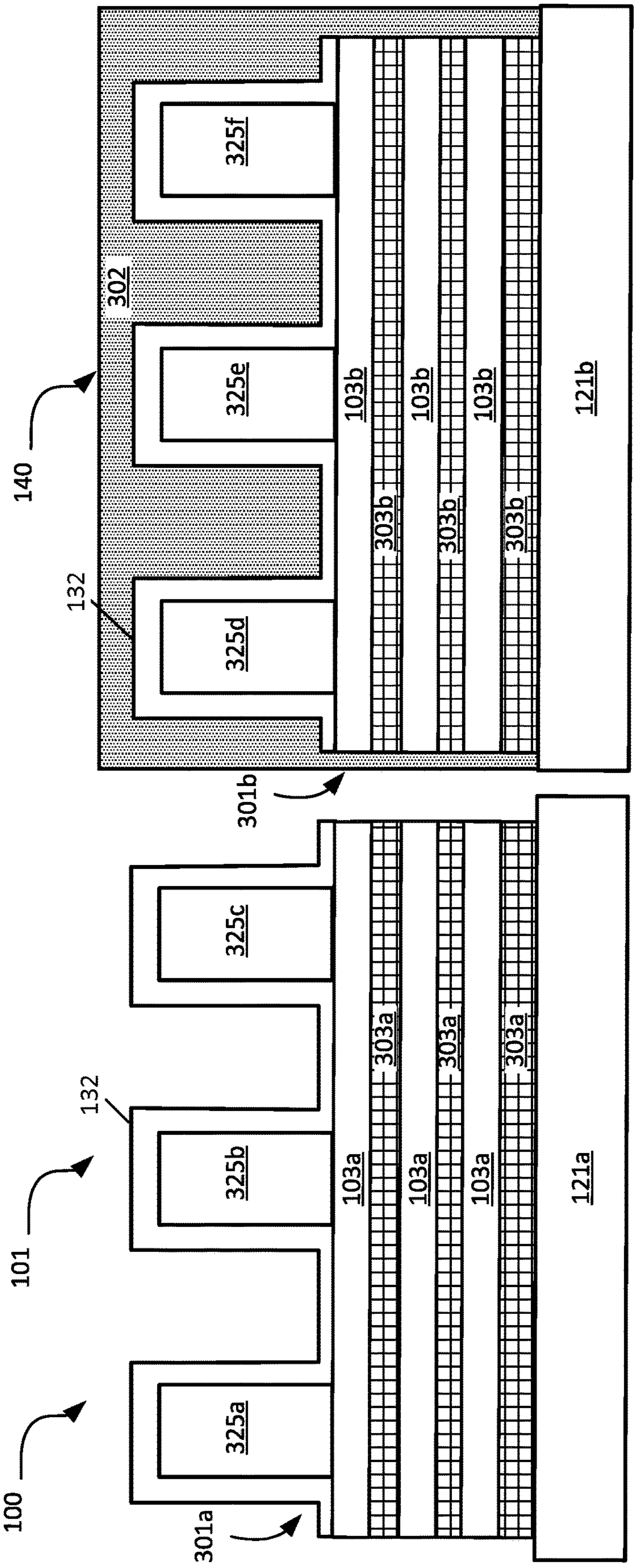

A mask (e.g., a hard mask, such as a carbon hard mask) is formed on a fin, e.g., on the right fin, the dummy gates above the right fin, and the first layer above the right fin (e.g., see FIG. 3B). The mask is formed above the right fin, but not above the left fin. The mask allows the left fin to be initially processed.

Note that the notations left and right devices (or left and right fins) are used herein as mere examples, e.g., for ease of identification, and is not intended to be limiting. However, the left and right devices can be interchanged, such that the above discussed mask is initially formed above the left fin and the left device is initially processed, prior to the right fin.

Figure 3C:
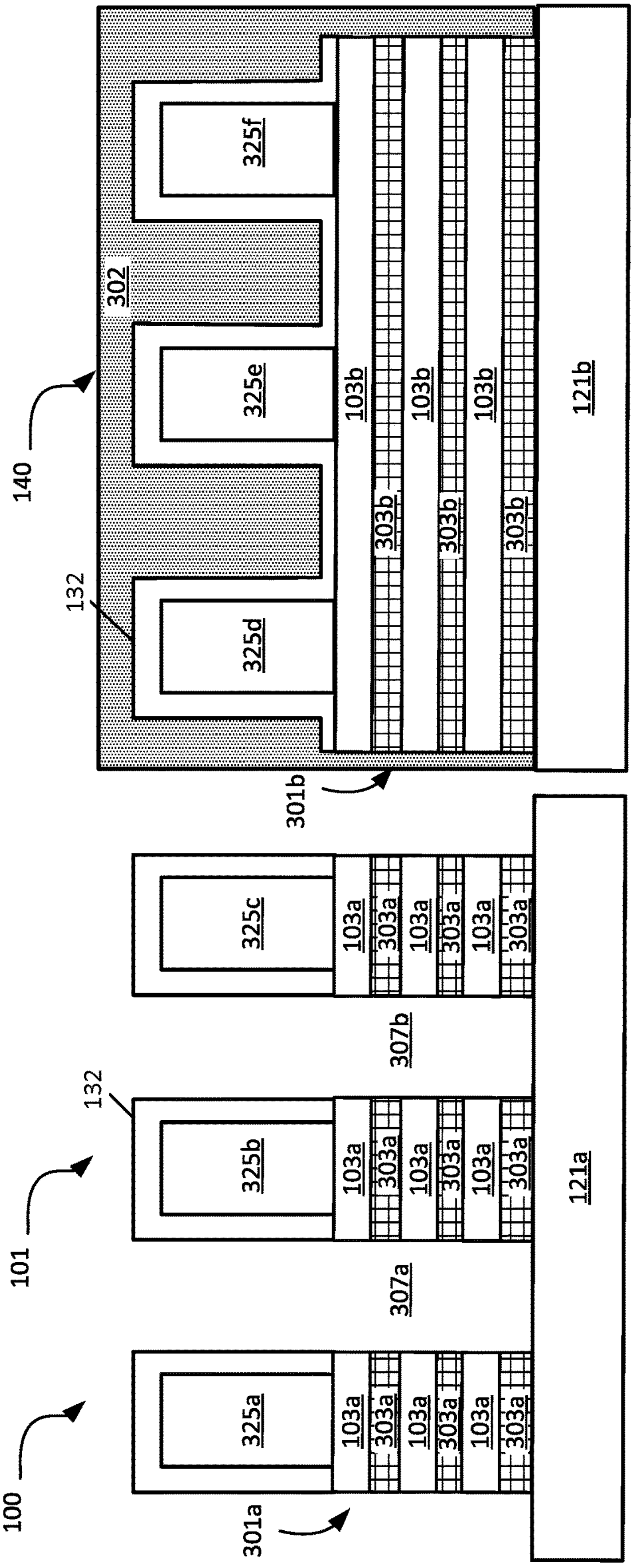

Now the left fin, which is not covered by the mask, is selectively recessed (e.g., portions of the left fin, which are not covered by the dummy gates, are recessed and removed), e.g., see FIG. 3C, which results in formation of source and drain trenches of the left device. Subsequently, end portions of the sacrificial materials of the left device are recessed through the source and drain trenches, e.g., see FIG. 3D. In an example, as the fin of the right device is still covered by the mask, the sacrificial material recessing process doesn't affect the right fin of the right device. In another example, the mask may be removed prior to, or during the sacrificial material recessing process, and the first layer of dielectric material on the right fin may continue to protect the sacrificial material and/or the channel material of the right fin from being etched. Subsequently, the mask on the right device is removed (e.g., see FIG. 3D1), and then left inner spacers are formed adjacent to the source and drain trenches of the left device, e.g., see FIG. 3E. In an example, the mask is then removed (although, as discussed herein later in further detail, the mask could have been removed at an earlier process as well). Subsequently, the source and drain regions of the left device are formed (e.g., grown epitaxially), e.g., see FIG. 3F. Note that after completion of the source and drain regions of the left device, the right fin of the right device has not yet been recessed and no source or drain trenches have yet been formed for the right device.

Subsequently, a second layer of dielectric material is deposited on the resultant structure, e.g., see FIG. 3G. For example, the second layer of dielectric material is blanket deposited to cover both the left and right devices. Subsequently, a second mask is formed on the left device, e.g., see FIG. 3H. Subsequently, the right fin of the right device (e.g., which is not covered by the second mask) is selectively recessed, e.g., see FIG. 3I. For example, sections of the right fin, which are not covered by the dummy gates, are recessed and removed, e.g., to form source and drain trenches of the right device. In an example, the second mask is then removed (although the second mask may be removed at a later downstream process as well), and end portions of the sacrificial materials of the right device are recessed through the source and drain trenches, e.g., see FIG. 3J. Inner spacers of the right device are formed within the source and drain trenches of the right device, e.g., see FIG. 3K. Subsequently, the source and drain regions of the right device are formed (e.g., grown epitaxially) within the source and drain trenches of the right device, e.g., see FIG. 3L. Note that the second layer of dielectric material protects the left device, while the inner spacers and the source and drain regions of the right device are being formed.

In an example, a third layer of dielectric material may now be deposited over the structure (see FIG. 3M), e.g., to protect the epitaxially grown source and drain regions from interlayer dielectric (ILD) formation process in source or drain trenches. For example, the ILD formation process may oxidize the source or drain regions, and the third layer of dielectric material prevents, or at least reduces such oxidation process. Subsequently, the dummy gates are removed, the sacrificial materials of the fins are removed to release the nanoribbons, and final gate structures of the left and right devices are formed, e.g., using appropriate techniques employed for GAA devices, as illustrated in FIGS. 3N-3Q. The source or drain contacts and the gate contacts may then be formed for both devices, e.g., see Fig. R.

Thus, as seen above, the inner spacers and the source and drain regions of the left device are formed, followed by formation of the inner spacers and the source and drain regions of the right device. For example, when these components of the left device are being formed, the right device is protected (e.g., masked) by a mask. Subsequently, the inner spacers and the source and drain regions of the right device are formed, while now the left device is protected by the above discussed second layer of dielectric material (note that the layer of dielectric material may not, or may, be later removed). Masking the right device while forming the above discussed components of left device, and similarly, protecting the left device (e.g., using the second layer of dielectric material) while forming the above discussed components of right device eliminates the need of using the thin film to cover the exposed tips of the channel materials, as discussed herein above. Accordingly, the techniques provided herein for forming the source or drain regions of the left and right devices avoid the above discussed contamination issues, thereby improving performance of the first and second devices.

Note that the second layer of dielectric material hasn't been deposited yet, e.g., when the inner spacers of the left device are being formed. In contrast, both the first and second layers of dielectric material have been deposited, e.g., when the inner spacers of the right device are being formed. Accordingly, in an example, as will also be discussed in further detail herein below, the inner spacers of the left device are formed below the first layer of dielectric material (and not below the second layer of dielectric material), while the inner spacers of the right device are formed below the second layer of dielectric material and may also be formed below the first layer of dielectric material.

In an example and as will be discussed herein below in further detail, a horizontal width of the inner spacers of the right device may be more than a horizontal width of the inner spacers of the left device, e.g., by at least 1 nm, or at least 1.5 nm, or at least 2 nm, or at least 2.5 nm, or at least 3 nm, or at least 4 nm, or at least 5 nm. However, in some other embodiments, the inner spacers of the left and right devices may be substantially similar, e.g., within 1 nm of each other. Various widths discussed herein are in a direction parallel to a length of the nanoribbons.

In an example, due to the formation process discussed herein above and also discussed in further detail herein below, a width of the source or drain regions of the left device may be more than a width of the source or drain regions of the right device, e.g., by at least 1 nm, or at least 1.5 nm, or at least 2 nm, or at least 2.5 nm, or at least 3 nm, or at least 4 nm, or at least 5 nm. However, in some other embodiments, the source or drain regions of the left and right devices may be substantially similar, e.g., within 1 nm of each other. Various widths discussed herein are in a direction parallel to a length of the nanoribbons. For example, a width w1 of the source or drain trenches of the left device is defined by opposing sidewalls of the first layer of dielectric material (see FIG. 3A), whereas a width w2 of the source or drain trenches of the right device is defined by opposing sidewalls of the second layer of dielectric material (see FIG. 3G). For reasons discussed herein below in further detail, width w2 may be less than width w1, thereby resulting in the difference in the widths of the source or drain regions of the left and right devices.

Note that the above discussed first, second, and third layers of dielectric materials are deposited using different deposition processes. Accordingly, there may be an interface (e.g., seam or grain boundary) between two adjacent sections of the first and second layers, and/or there may be an interface (e.g., seam or grain boundary) between two adjacent sections of the second and third layers, in an example.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools be used to detect a first device laterally adjacent to a second device, wherein a first layer and a second layer of dielectric materials are between a gate contact and a source or drain contact of each of the devices, and wherein inner spacers of one of the devices (e.g., the first device) are formed below the first layer of dielectric material (and not below the second layer of dielectric material), while the inner spacers of the other one of the devices (e.g., the second device) are formed below the second layer of dielectric material and may also be formed below the first layer of dielectric material. In an example, an interface (such as a seam or grain boundary) is between an adjacent section of the first layer and an adjacent section of the second layer of dielectric materials. In an example, a horizontal width of the inner spacers of the first device and a horizontal width of the inner spacers of the second device differ by at least 1 nm, or at least 1.5 nm, or at least 2 nm, or at least 2.5 nm, or at least 3 nm, or at least 4 nm, or at least 5 nm. In an example, a horizontal width of a source or drain region of the first device and a horizontal width of the source or drain region of the second device differ by at least 1 nm, or at least 1.5 nm, or at least 2 nm, or at least 2.5 nm, or at least 3 nm, or at least 4 nm, or at least 5 nm. Various widths discussed herein are in a direction parallel to a length of a channel region of either of the first or second devices. Numerous configurations and variations will be apparent in light of this disclosure.

Architecture

FIG. 1A illustrates a cross-section view of an integrated circuit structure 100 (also referred to herein as "structure 100") including a left device 101 and a right device 140, wherein the left device 101 comprises (i) a left source region 104*a*, (ii) a left drain region 104*b*, (iii) a plurality of left inner spacers 134*a*, each left inner spacer 134*a* adjacent to a corresponding one of the left source or drain regions, wherein the right device 140 comprises (i) a right source region 106*a*, (ii) a right drain region 106*b*, (iii) a plurality of right inner spacers 134*b*, each right inner spacer 136*a* adjacent to a corresponding one of the right source or drain regions, wherein (A) a width w1 of at least one of the left source or drain regions 104*a*, 104*b* is at least 1 nm different from a width w2 of at least one of the right source or drain regions 106*a*, 106*b*, and/or (B) a width w3 of at least one of the plurality of left inner spacers 134*a* is at least 1 nm different from a width w4 of at least one of the plurality of right inner spacers 134*b*, wherein the widths are measured in a lateral direction parallel to a length of a channel region (e.g., comprising nanoribbons 103) of the left or right devices, in accordance with an embodiment of the present disclosure.

As can be seen, the cross-section of FIG. 1A is taken parallel to, and through, the fin structure, such that the channel, source, and drain regions of the two devices are shown. This particular cross-section includes three channel regions for each device, but any number of channel regions and corresponding source and drain regions can be included, as will be appreciated. Further note that all devices shown in this example are contacted, but other examples may include dummy devices or devices that are not connected into the overall circuit. The semiconductor bodies 103*a* and 103*b* included in the channel regions of the devices 101 and 140, respectively, can vary in form, but in this example embodiment are in the form of nanoribbons. In particular, the channel regions of the left device 101 in this example case include a set of four nanoribbons 103*a*, and the channel regions of the right device 140 include a set of four nanoribbons 103*b*. Other examples may include fewer nanoribbons per channel region (e.g., one, two, or three), or more nanoribbons per channel region (e.g., five or six). Still other embodiments may include other channel configurations, such as one or more nanowires or nanosheets or other semiconductor body of a GAA device, or transistors such as forksheet transistors.

The device configuration includes laterally adjacent devices 101 and 140. There may be an isolation region, one or more other devices, and/or dielectric material (such as interlayer dielectric material or ILD) between the two laterally adjacent devices 101, 140. In an example, one of the two devices 101, 140 is a PMOS device and the other of the two devices 101, 140 is an NMOS device. In an example, the devices 101, 140 may be arranged in a complementary metal-oxide semiconductor (CMOS) configuration. Note the devices 101, 140 being identified as a left device and a right device, respectively, is merely for the sake of identifying the two devices, such delineation does not necessarily indicate that that the device 101 has to be always on the left of the device 140 (e.g., the device 140 may also be on a left side of the device 101 in an example).

In the example of FIG. 1A, the left device 101 includes the source region 104*a* and the drain region 104*b*, each adjacent to a gated channel region on either side. Note that sections of two source or drain regions 104*c* and 104*d* (e.g., which may be of another device that is not specifically labelled in FIG. 1A) on either side of the device 101 are also illustrated in FIG. 1A, where the source or drain regions 104*c* and 104*d* are of the adjacent devices not fully illustrated in FIG. 1A. In an example, either or both the source or drain regions 104*c* and 104*d* may be replaced by, for example, an isolation region comprising dielectric material. Note that the source region 104*a* and the drain region 104*b* of the device 101 are each adjacent to a gated channel region on either side. Other embodiments may not have gated channel regions to each side, such as the example case where only the channel region between source region 104*a* and drain region 104*b* is present.

In the example of FIG. 1A, the right device 140 includes the source region 106*a* and the drain region 106*b*, each adjacent to a gated channel region on either side. Note that sections of two source or drain regions 106*c* and 106*d* (e.g., which may be of another device that is not specifically labelled in FIG. 1A) on either side of the device 140 are also illustrated in FIG. 1A, where the source or drain regions 106*c* and 106*d* are of the adjacent devices not fully illustrated in FIG. 1A. In an example, either or both the source or drain regions 106*c* and 106*d* may be replaced by, for example, an isolation region comprising dielectric material. Note that the source region 106*a* and the drain region 106*b* of the device 140 are each adjacent to a gated channel region on either side. Other embodiments may not have gated channel regions to each side, such as the example case where only the channel region between source region 106*a* and drain region 106*b* is present. Note that in an example, the location of the source and drain regions in one or both devices 101, 140 may be interchangeable.

Although not illustrated, in an example, each of the source or drain regions may comprise a relatively lightly doped nucleation region and a relatively heavily doped main region. Numerous source and drain configurations can be used, and the present disclosure is not intended to be limited to any particular ones. In some example embodiments, the various source and drain regions are epitaxial source and drain regions that are provided after the relevant portion of the fin or fin structure was isolated and etched away or otherwise removed. In other embodiments, the source/drain regions may be doped portions of the fin structure or substrate, rather than epi regions. In some embodiments using an etch and replace process, the epi source and drain regions are faceted and overgrown from a trench within insulator material (e.g., shallow trench isolation, or inner spacer that deposits on the sides of the fin structure in the source and drain locations), and the corresponding source or drain contact structure lands on that faceted portion. Alternatively, in other embodiments, the faceted portion of epi source and drain regions can be removed (e.g., via chemical mechanical planarization, or CMP), and the corresponding source or drain contact structure lands on that planarized portion.

The source and drain regions can be any suitable semiconductor material and may include any dopant scheme. In an example, source and drain regions can be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, PMOS source and drain regions are boron-doped SiGe, and NMOS source and drain regions are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used as will be appreciated, and the present disclosure is not intended to be limited to any particular such configurations.

As discussed, the devices 101 and 140 are laterally adjacent. For example, a right edge of the drain region 104*b* of the device 101 and a left edge of the source region 106*a* of the device 140 is laterally separated by a distance that is in the range of 15-1000 nm, or in a subrange of 15-800 nm, 15-600 nm, 15-400 nm, 15-200 nm, 15-100 nm, 100-1000 nm, 100-800 nm, 100-500 nm, 100-200 nm, 200-500 nm, or another appropriate subrange thereof.

Referring to the device 101, in one embodiment, one or more gate structures 122 of the device 101 wraps around each of the nanoribbons 103*a* in the corresponding channel region. Note that a gate structure 122 of the device 101 is labelled within an expanded view of a section 149*a* of the device 101. Inner spacers 134*a* isolate the gate structures 122 from contacting the source region 104*a* and the drain region 104*b*. Thus, an inner spacer 134*a* is laterally between a gate structure 122 and a corresponding one of a source or drain region 104*a*, 104*b*. In other embodiments, there may be other insulator layers (e.g., interlayer dielectric) that prevent such contact, whether in addition to the gate spaces 134*a*, or in place of the inner spacers 134*a*. In an example, conductive gate contacts 125*a*, 125*b*, and 125*c* provide contacts to respective three gate structures of the device 101.

In one embodiment, each of gate structures 172 of the device 140 wraps around each of the nanoribbons 103*b* in the corresponding channel region. Note that a gate structure 172 of the device 140 is labelled within an expanded view of a section 149*b* of the device 140. Inner spacers 134*b* isolate the gate structures 172 from contacting the source region 106*a* and the drain region 106*b*. Thus, an inner spacer 134*b* is laterally between a gate structure 172 and a corresponding one of a source or drain region 106*a*, 106*b*. In other embodiments, there may be other insulator layers (e.g., interlayer dielectric) that prevent such contact, whether in addition to the gate spaces 134*b*, or in place of the inner spacers 134*b*. In an example, conductive gate contacts 125*d*, 125*e*, and 125*f* provide contacts to respective three gate structures 172 of the device 140.

Each of gate structures 122, 172 can be formed via gate-first or gate-last processing, and may include any number of suitable gate materials and configurations. In an embodiment, each of the gate structures 122, 172 includes a corresponding gate electrode and a gate dielectric 120 between the gate electrode and the corresponding nanoribbons 103, where the gate dielectric 120 is illustrated in the expanded views of the sections 149*a* and 149*b* of the devices 101, 140.

In one example the inner spacers 134 may be considered part of the gate structure, whereas in another example the inner spacers 134 may be considered external to the gate structure. Each of the gate structures 122 of the left device 101 comprises a corresponding gate electrode 105*a* and corresponding dielectric material 120. Note that the dielectric material 120 of the gate structures 122 is illustrated in an expanded view of the section 149*a* of the device 101. Each of the gate structures 172 of the right device 140 comprises a corresponding gate electrode 105*b* and corresponding dielectric material 120. Note that the dielectric material 120 of the gate structures 172 is illustrated in an expanded view of a section 149*b* of the device 140.

The gate dielectric material 120 warps around middle section of individual nanoribbons 103 (note that end sections of individual nanoribbons 103 are wrapped around by the inner spacers 134). The gate dielectric material 120 is between individual nanoribbons 103 and corresponding gate electrode, as illustrated. In an example, due to conformal deposition of the gate dielectric material 120, the gate dielectric material 120 may also be on inner sidewalls of the inner spacers 134, as illustrated in the expanded views of the sections 149*a*, 149*b*.

The gate dielectric 120 may include a single material layer or multiple stacked material layers. The gate dielectric 120 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 120 is lanthanum. In some embodiments, the gate dielectric can be annealed to improve its quality when high-k dielectric material is used. In some embodiments, the gate dielectric 120 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer.

In an example, the gate electrode 105*a* of the device 101 and the gate electrode 105*b* of the device 140 may include any sufficiently conductive material, such as a metal, metal alloy, or doped polysilicon. The gate electrodes may include a wide range of materials, such as polysilicon or various suitable metals or metal alloys, such as aluminum, tungsten, titanium, tantalum, copper, cobalt, molybdenum, titanium nitride, or tantalum nitride, for example.

In one embodiment, one or more work function materials (not illustrated in FIG. 1A) may be included around the nanoribbons 103. Note that work function materials are called out separately, but may be considered to be part of the gate electrodes. In this manner, a gate electrode may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons 103. In still other embodiments, there may be insufficient room for any gate fill material, after deposition of work function material (i.e., a given gate electrode may be all work function material and no fill material). Numerous gate structure configurations can be used along with the techniques provided herein, and the present disclosure is not intended to be limited to any particular such configurations.

The semiconductor bodies 103*a*, 103*b*, which in this case are nanoribbons, can be any number of semiconductor materials, such as group IV material (e.g., silicon, germanium, or SiGe) or group III-V materials (e.g., indium gallium arsenide). In other embodiments, the semiconductor bodies 103 may be fins on which the corresponding gate structures are formed to provide double-gate or tri-gate configurations (as opposed to gate-all-around configurations with nanoribbons or wires). The semiconductor bodies 103 may be lightly doped, or undoped, and may be shaped or sculpted during the gate formation process, according to some embodiments. In some cases, semiconductor bodies 103 may be a multilayer structure, such as a SiGe body cladded with germanium, or a silicon body cladded with SiGe. Any number of channel configurations can be used.

As illustrated in FIG. 1A, for the device 101, a source contact 114*a* is coupled to the source region 106*a*, and a drain contact 144*b* is coupled to the drain region 104*b*. Similarly, for the device 140, a source contact 145*a* is coupled to the source region 106*a*, and a drain contact 145*b* is coupled to the drain region 106*b*. Although not illustrated, in an example, a corresponding source or drain contact may at least in part extend within or through the corresponding source or drain region, e.g., to form an embedded contact. Also illustrated are sections of source or drain contacts 144*c*, 144*d*, 145*c*, 145*d* of respective source or drain regions of FIG. 1A. Although not illustrated, one or more layers, such as a silicide, a germanide, a germanosilicide, an adhesive layer, and/or a barrier or liner layer may be between a source or drain contact and a corresponding source or drain region, where such one or more layers reduce contact resistance and/or prevents or reduces diffusion of contact metal to adjacent dielectric material, for example.

In an example, individual ones of the source or drain contacts 144, 145 comprises conductive material, such as one or more metals or an alloy thereof. Example materials of the source or drain contacts include one or more metals such as titanium (Ti), vanadium (V), zirconium (Zr), Niobium (Nb), iron (Fe), cobalt (Co), nickel (Ni), ruthenium (Ru), rhenium (Re), osmium (Os), iridium (Ir), platinum (Pt), rhodium (Rh), palladium (Pd), hafnium (Hf), tantalum (Ta), tungsten (W), molybdenum (Mo), and/or carbides, borides, silicides, and/or germanides thereof (e.g., in dilute and/or stochiometric form).

In one embodiment, a plurality of layers comprising dielectric materials separate a source or drain contact from an adjacent gate contact. For example, layers 132, 136, 150 comprising dielectric materials are adjacent to each of the gate contacts 125*a*, . . . , 125*f*, and separate a gate contact 125 from an adjacent source or drain contact. For example, each layer 132 of dielectric material is adjacent to a corresponding gate contact 125. Each layer 132 is laterally between a corresponding gate contact 125 and a corresponding layer 136. For example, the layer 132 separates the corresponding gate contact 125 from the layer 136. In an example, at least a section of a layer 150 is between a corresponding section of the layer 136 and a source or drain contact 144 or 145. Thus, three layers 132, 136, 150 of dielectric materials separate a source or drain contact from an adjacent gate contact, as illustrated.

In an example, the dielectric materials of layers 132 and 136 may be compositionally and/or elementally the same or different. Similarly, in an example, dielectric materials of layers 136 and 150 may be compositionally and/or elementally the same or different. In an example, each of the layers 132, 136, and 150 are formed using different process flows, e.g., formed at different times during the processes to form the structure 100, as will be discussed herein below with respect to FIGS. 2A-3R. Accordingly, in an example, an interface, such as a seam or a grain boundary, is between a section of a layer 132 and a corresponding adjacent section of a layer 136. Similarly, in an example, an interface, such as a seam or a grain boundary, is between a section of a layer 136 and a corresponding adjacent section of a layer 150.

In an example, each of the layers 132, 136, and 150 comprises an appropriate dielectric material, such as silicon oxide, silicon nitride, and/or another appropriate nitride, oxide, carbide, oxycarbide, oxynitride, or oxycarbonitride. As discussed, the dielectric materials of layers 132, 136, and/or 150 may be compositionally and/or elementally the same or different. As also discussed, irrespective of the composition of the dielectric materials of the layers 132, 136, and 150, an interface (e.g., a seam or grain boundary) is present between adjacent sections of the layers 132 and 136, and/or between adjacent sections of the layers 136 and 150.

In an example, a width of the source and/or drain regions 104*a*, 104*b* of the device 101 is about w1, and a width of the source and/or drain regions 106*a*, 106*b* of the device 140 is about w2, where the widths w1, w2 are measured in a direction parallel to a direction in which the nanoribbons 103 extend, such as in the X axis direction in FIG. 1A.

In an example, the widths w1 and w2 are substantially the same, e.g., within 1 nm, or 1.5 nm, or 2 nm of each other. In another example and as will be discussed herein below in further detail, the widths w1 and w2 may be different from each other by at least 1 nm, or at least 1.5 nm, or at least 2 nm, or at least 2.5 nm, or at least 3 nm, or at least 4 nm, or at least 5 nm. For example, as will be discussed in further detail herein below with respect to FIGS. 3A-3F, each of the source and drain regions 104*a*, 104*b* is formed within a corresponding recess defined by two layers 132. For example, the source region 104*a* is formed within a recess 307*a* (see FIG. 3E) defined by (i) a layer 132 on a right side of the gate contact 125*a* and (ii) a layer 132 on a left side of the gate contact 125*b*, where the width of the recess is w1. In contrast, as will be discussed in further detail herein below with respect to FIGS. 3G-3L, each of the source and drain regions 106*a*, 106*b* is formed within a corresponding recess defined by two layers 136. For example, the source region 106*a* is formed within a recess 309*a* (see FIG. 3K) defined by (i) a layer 136 on a right side of the gate contact 125*d* and (ii) a layer 136 on a left side of the gate contact 125*e*, where the width of the recess is w2. Accordingly, as will also be discussed with respect to FIGS. 2A-2B and 3A-3R, such processes for formation of the different source or drain regions may result in the width w1 being different from (e.g., larger than) the width w2, in an example. For example, the width w1 may be greater than the width w2 by at least 1 nm, or at least 1.5 nm, or at least 2 nm, or at least 2.5 nm, or at least 3 nm, or at least 4 nm, or at least 5 nm.

In an example, each inner spacer 134*a* of the device 101 is formed below a corresponding layer 132, and no portion of the inner spacer 134*a* is below the layer 136. For example, as will be discussed herein below in further detail with respect to FIG. 3E, individual inner spacer 134*a* of the device 101 is formed below the layer 132, and is formed prior to formation of the layer 136. Accordingly, each inner spacer 134*a* of the device 101 is formed below a corresponding layer 132, and no portion of the inner spacer 134*a* is below the layer 136.

In contrast, each inner spacer 134*b* of the device 140 is formed below a corresponding layer 136, and some portion of the inner spacer 134*b* may also be below the corresponding layer 132. For example, as will be discussed herein below in further detail with respect to FIG. 3K, individual inner spacer 134*b* of the device 140 is formed below the layer 136 and may also be below the layer 132. Thus, while at least some section of the inner spacer 134*b* is below the corresponding layer 136, no portion of the inner spacer 134*a* is below the layer 136.

In an example, a side wall of an inner spacer 134*a* and/or 134*b* is aligned with a side wall of a corresponding gate electrode 125. As an example, a left sidewall of the inner spacer 134*a* on an immediate left of the source region 104*a* is substantially aligned (e.g., substantially coplanar) with a right sidewall of the gate electrode 125*a*. In another example, a right sidewall of the inner spacer 134*b* on an immediate right of the source region 106*a* is substantially aligned (e.g., substantially coplanar) with a left sidewall of the gate electrode 125*e*.

In an example, a width of the inner spacer 134*a* of the device 101 is about w3, and a width of the inner spacer 134*b* of the device 140 is about w4, where the widths w3 and w4 are measured in a direction parallel to a direction in which the nanoribbons 103 extend, such as in the X axis direction in FIG. 1A. In an example, the width w4 is greater than the width w3 by at least 1 nm, or at least 1.5 nm, or at least 2 nm, or at least 2.5 nm, or at least 3 nm, or at least 4 nm, or at least 5 nm, as will be discussed in further detail herein later. In an example, the difference in the widths w3 and w4 are due to (i) the above discussed differences in locations of the inner spacers 134*a*, 134*b* (e.g., while at least some section of the inner spacer 134*b* is below the corresponding layer 136, no portion of the inner spacer 134*a* is below the layer 136) and/or (ii) the above discussed alignment of the inner spacer side wall with corresponding sidewall of the corresponding gate electrode.

Figure 1B:
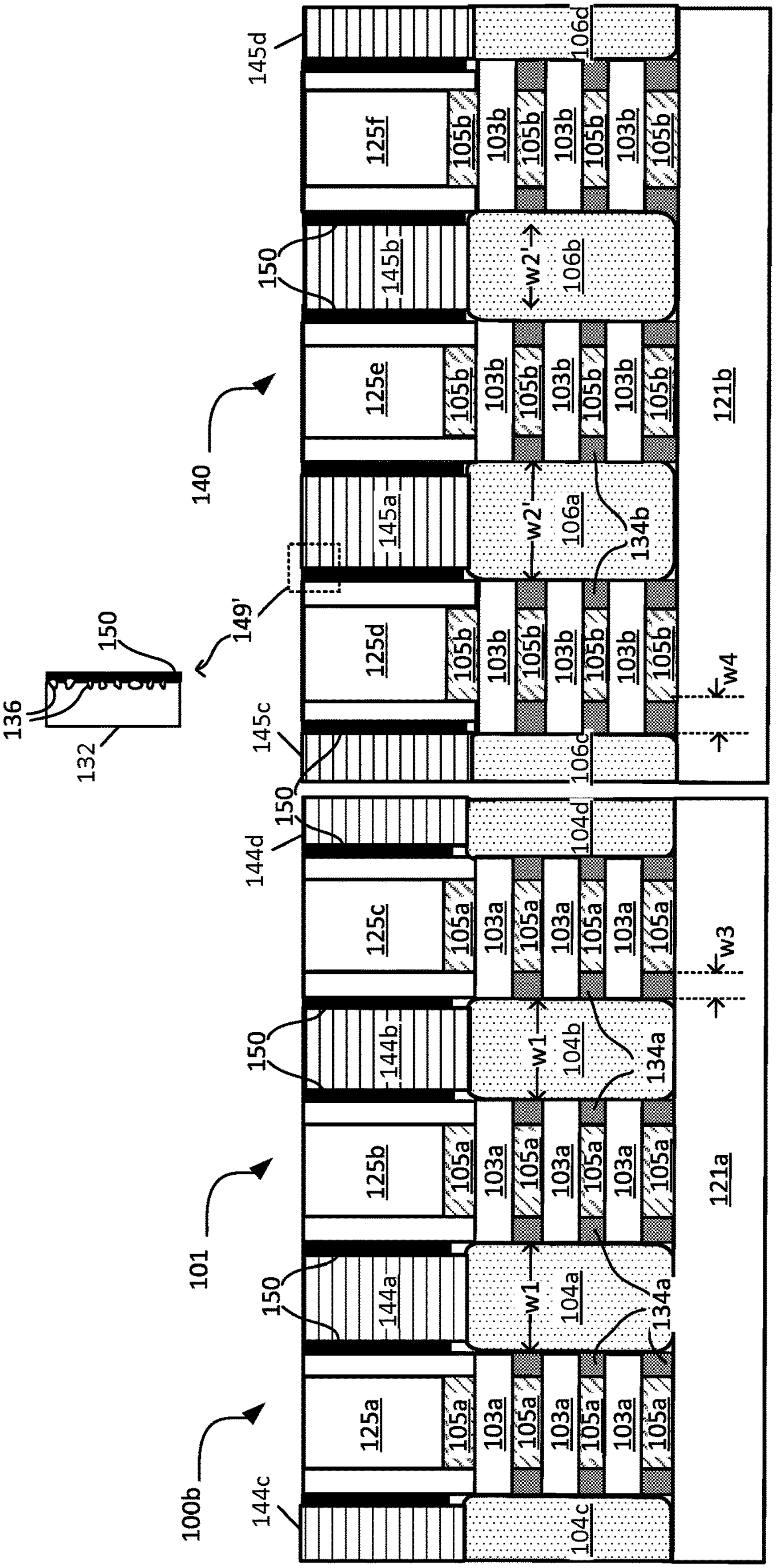
FIG. 1B illustrates an integrated circuit structure that is at least in part similar to the integrated circuit structure of FIG. 1A, and that has discontinuous remnants of a layer between adjacent gate contacts and source or drain contacts, in accordance with an embodiment of the present disclosure.

In FIG. 1A, each section of the layer 136 is shown to be continuous. However, in an example, the layer 136 may be a discontinuous layer. FIG. 1B illustrates an integrated circuit structure 100*b* (also referred to herein as "structure 100*b*") that is at least in part similar to the integrated circuit structure 100 of FIG. 1A, and that has discontinuous remnants of a layer 136 between adjacent gate contacts 125 and source or drain contacts 144, 145, in accordance with an embodiment of the present disclosure. For example, the discontinuous remnants of the layer 136 is illustrated in an expanded view of a section 149' of the device 140. In an example, such discontinuous remnants of the layer 136 may be between each adjacent sections of the layers 132 and 150. For example, after formation of the inner spacers 134*b* (see FIG. 3K) and before deposition of the layer 150 (see FIG. 3M), the layer 136 may be removed (e.g., using an appropriate etch process), leaving behind remnants of the layer 136, as illustrated in FIG. 1B.

Figure 1C:
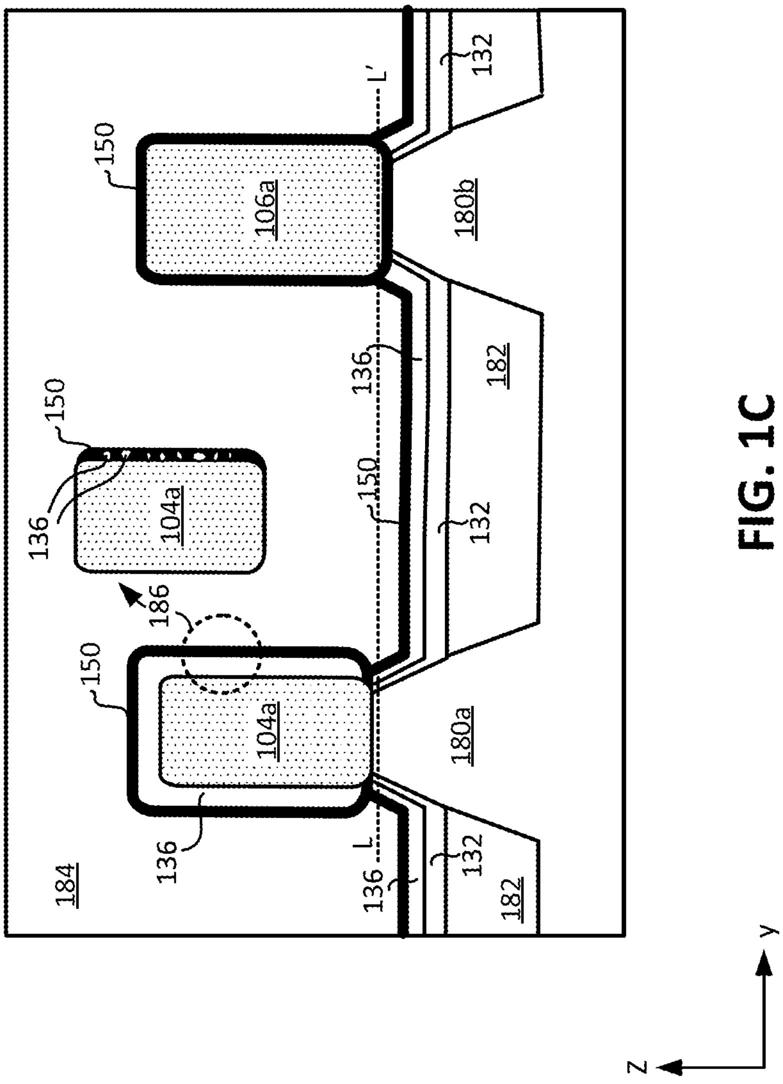
FIG. 1C illustrates cross sectional views of a source region of the left device and a source region of the right device of FIG. 1A, in accordance with an embodiment of the present disclosure.

FIG. 1C illustrates cross sectional views of the source region 104*a* of the device 101 and the source region 106*a* of the device 140, in accordance with an embodiment of the present disclosure. The cross-sectional view of the source region 104*a* is along line A-A' of FIG. 1A, and the cross-sectional view of the source region 106*a* is along line B-B' of FIG. 1A. In an example, the drain regions 104*b* and 106*b* may have structures that are at least in part similar to the corresponding source regions 104*a* and 104*b*, respectively. The sections of the source regions illustrated in FIG. 1C are in front of, and behind, the plane of the source regions illustrated in FIG. 1A.

As illustrated in FIG. 1C, the layer 136 is on one or more (e.g., all) sidewalls of the source region 104*a*, and the layer 150 is on the layer 136. In an example, a continuous section of the layer 136 is between sidewalls of the source region 104*a* and the layer 150, as illustrated in FIG. 1C. In another example where the layer 136 may be removed (e.g., see discussion with respect to FIG. 1*i*), discontinuous remnants of the layer 136 are between sidewalls of the source region 104*a* and the layer 150, as illustrated in an alternate expanded of a section 186 of the source region 104*a*. Note that in contrast, the layer 136 is absent on sidewalls of the source region 106*a*, and the layer 150 is directly on sidewalls of the source region 106*a*. For example, as discussed herein below in further details, layer 136 is deposited (see FIG. 3G) subsequent to formation of the source or drain regions 104*a*, 104*b*, 104*c*, 104*d*, and hence, the layer 136 is on sidewalls of the source or drain regions 104*a*, 104*b*, 104*c*, 104*d*. However, when the layer 136 is deposited, the source or drain regions 106*a*, 106*b*, 106*c*, 106*d* have not yet been formed (e.g., see FIG. 3L for formation of the source or drain regions 106*a*, 106*b*, 106*c*, 106*d*). Accordingly, the layer 136 on not on the sidewalls of the source or drain regions 106*a*, 106*b*, 106*c*, 106*d*.

In an example, a bottom surface of the source or drain regions 104*a*, 104*b* of the device 101 may not be coplanar with a bottom surface of the source or drain regions 106*a*, 106*b* of the device 140. For example, as will be discussed herein below in further details, trenches for the source or drain regions 104*a*, 104*b* of the device 101 are formed using first one or more processes (e.g., see FIG. 3C), and trenches for the source or drain regions 106*a*, 106*b* of the device 140 are formed using second one or more different processes (e.g., see FIG. 3I), thereby possibly resulting in a vertical difference in a first horizontal plane of the bottom surface of the source or drain regions 104*a*, 104*b* and a second horizontal plane of the bottom surface of the source or drain regions 106*a*, 106*b*. For example, horizontal line L-L' of FIG. 1C indicates that the second horizontal plane is lower than the first horizontal plane in the example of FIG. 1C, although the second horizontal plane may be higher than the first horizontal plane in another example. In an example, a vertical distance between the two horizontal planes may be at least 1 nm, or at least 2 nm, or at least 3 nm, or at least 4 nm.

Also illustrated in FIG. 1C are interlayer dielectric material (ILD) 184 surrounding various components, and sub-fin regions 180*a*, 180*b*. Note that there may be various other components, such as drain region 104*b*, some of the nanoribbons 103*a*, 103*b*, and one or more other components laterally between the source regions 104*a* and 106*a*, although these components are not illustrated in FIG. 1C.

Figure 2A:
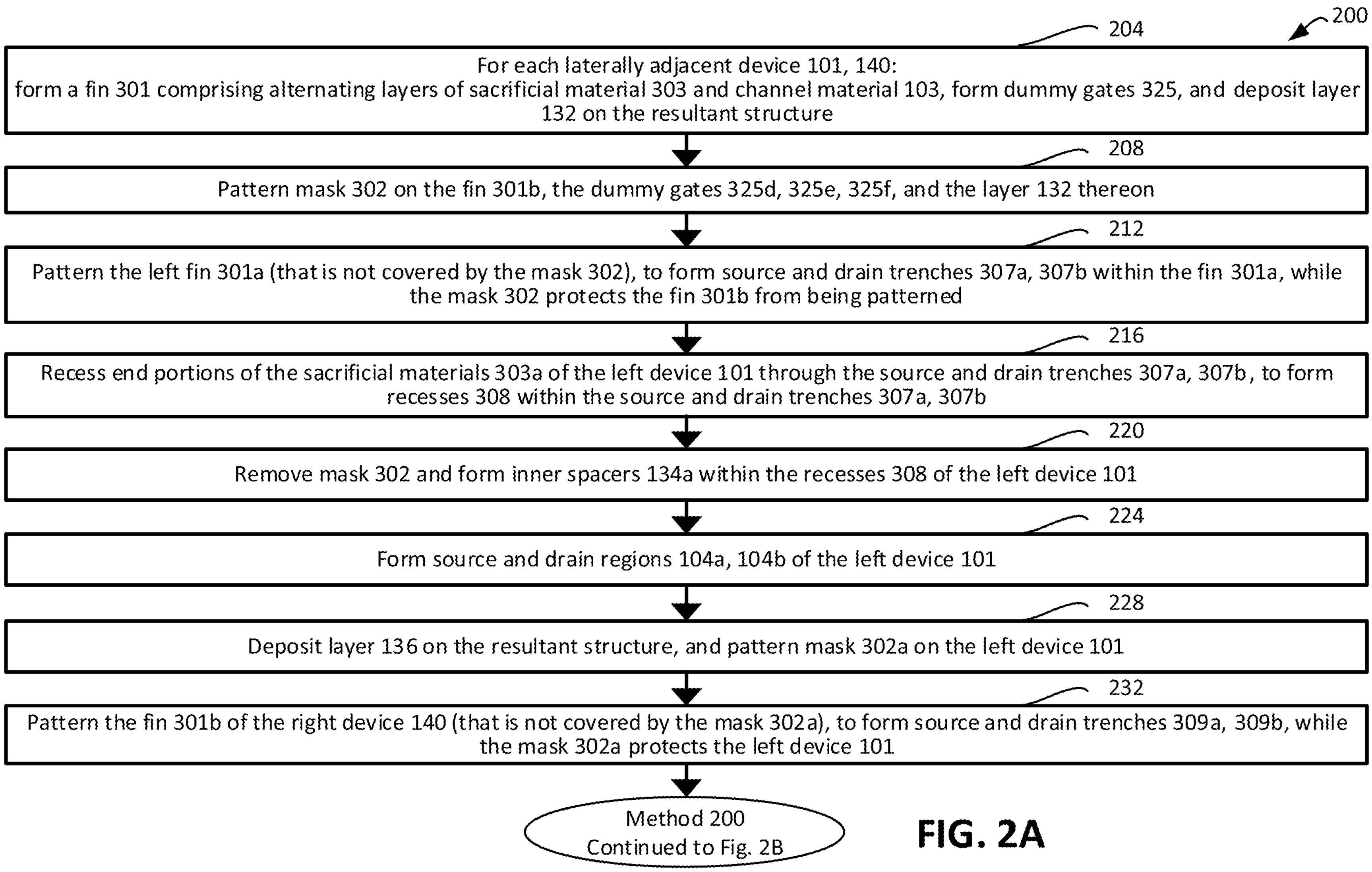
FIGS. 2A and 2B illustrate a flowchart depicting a method of forming the example nanoribbon semiconductor structures of FIGS. 1A-1C, in accordance with an embodiment of the present disclosure.
Figure 2B:
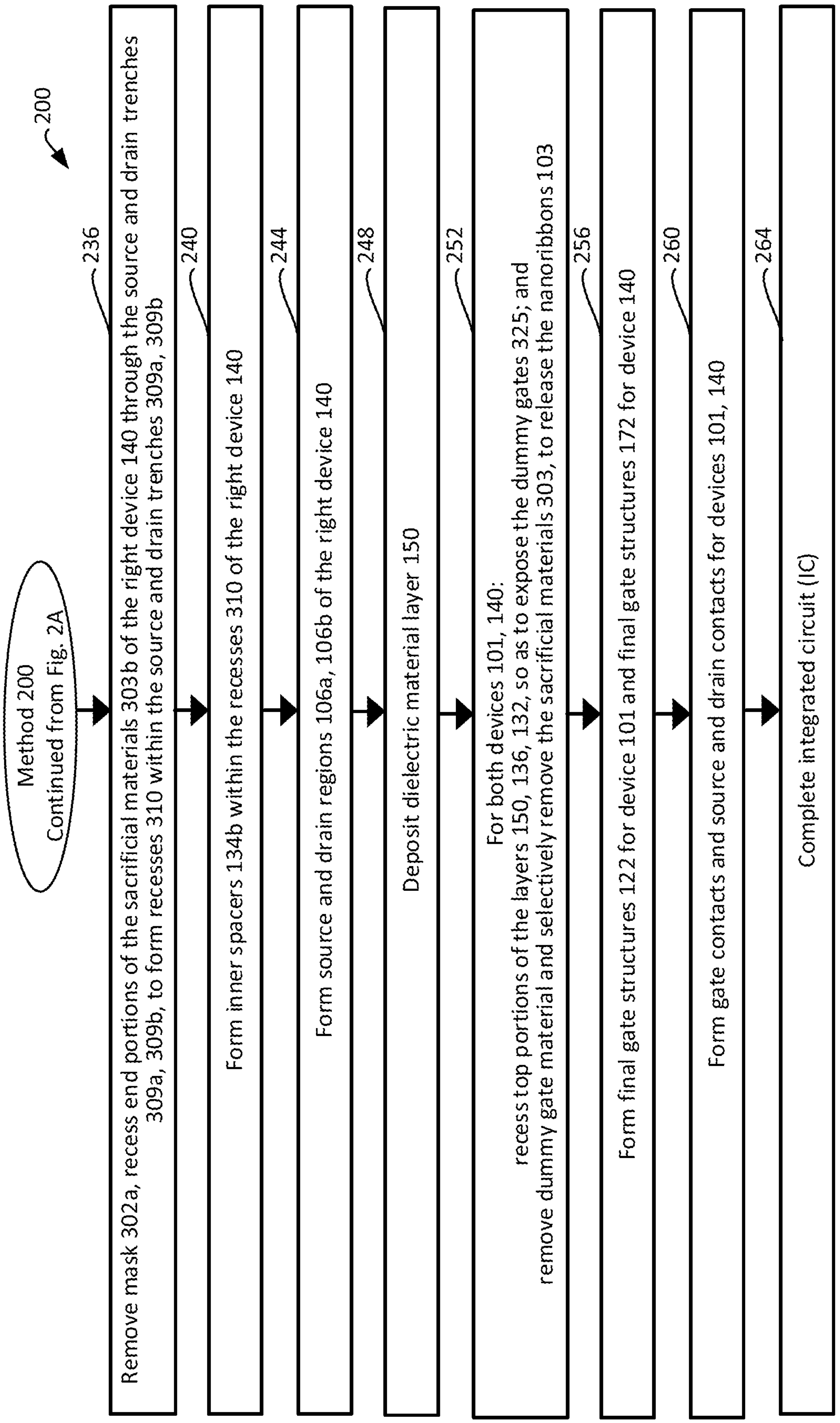

FIGS. 2A and 2B illustrate a flowchart depicting a method 200 of forming the example nanoribbon semiconductor structures 100 and 100*b* of FIGS. 1A-1C, in accordance with an embodiment of the present disclosure. FIGS. 3A, 3B, 3C, 3D, 3D1, 3E, 3F, 3G, 3H, 3I, 3J, 3K, 3L, 3M, 3N, 3O, 3P, 3Q, and 3R collectively illustrate cross-sectional views of an example semiconductor structure (e.g., the semiconductor structures of FIGS. 1A-1) in various stages of processing, in accordance with an embodiment of the present disclosure. FIGS. 2A-2B and 3A-3R will be discussed in unison. The cross-sectional views of FIGS. 3A-3R correspond to the cross-sectional view of FIG. 1A.

Referring to FIG. 2A, the method 200 includes, at 204, for each of the laterally adjacent devices 101 and 140, forming a corresponding fin 301 comprising alternating layers of sacrificial material 303 and channel material 103, forming dummy gates 325 above the fins 301, and depositing layer 132 comprising dielectric material above the resultant structure, e.g., as illustrated in FIG. 3A. For example, FIG. 3A illustrates a fin 301*a* that would be used to eventually form the device 101, and a laterally adjacent fin 301*b* that would be used to eventually form the device 140. The left fin 301*a* comprises alternating layers of sacrificial material 303*a* and channel material 103*a*, and the right fin 301*b* comprises alternating layers of sacrificial material 303*b* and channel material 103*b*, as illustrated in FIG. 3A. The sacrificial materials 303 are etch selective to the channel materials 103, e.g., an etch process to etch the sacrificial materials 303 may not substantially etch (or etch at a slower rate) the channel materials 103. Examples of sacrificial materials 303 include, for example, silicon germanium (SiGe) or another appropriate sacrificial material used to form GAA devices. Dummy gates 325*a*, 325*b*, and 325*c* are formed over the fin 301*a*, and dummy gates 325*d*, 325*e*, and 325*f* are formed over the fin 301*b*. In an example, the fins 301 and the dummy gates 325 are formed using any appropriate techniques for forming fins and dummy gates of GAA transistors. In an example, the layer 132 is deposited using an appropriate deposition technique, such as such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. Example materials of the layer 132 has been discussed herein above. In an example, the layer 132 is blanket deposited on various components of the structure 100. Note the distance w1 between two opposing sidewalls of the layer 132, as illustrated in FIG. 3A. As will be seen herein below, the source and drain regions 104*a*, 104*b* of the left device 101 formed later will have this width w1.

The method 200 then proceeds from 204 to 208, where a mask 302 (e.g., a hard mask, such as a carbon hard mask) is patterned on the fin 301*b*, the dummy gates 325*d*, 325*e*, 325*f*, and the layer 132 thereon, as illustrated in FIG. 3B. Thus, the components to be used to form the right device 140 are masked, such that the left device 101 can be processed. The mask 302 is etch selective to the layer 13, the sacrificial material 303, and the channel material 103, such that an etch process to etch the layer 132, the sacrificial material 303, and the channel material 103 may not substantially etch (or etch at a slower rate) the mask 302.

The method 200 then proceeds from 208 to 212, where the left fin 301*a* (e.g., which is not covered by the mask 302) is patterned, to form source and drain trenches 307*a*, 307*b* within the fin 301*a*, while the mask 302 protects the right fin 301*b* from being patterned, as illustrated in FIG. 3C. Thus, the source and drain trenches 307*a*, 307*b* for the left device 101 are formed, without forming the source or drain trenches within the fin 301*b* of the right device 140 (e.g., which is protected by the mask 302). In an example, the patterning process 212 may be performed using one or more appropriate etch processes that is etch selective to the mask 302 (e.g., the mask 302 is not substantially etched, or etched at a slower rate).

Figure 3D:
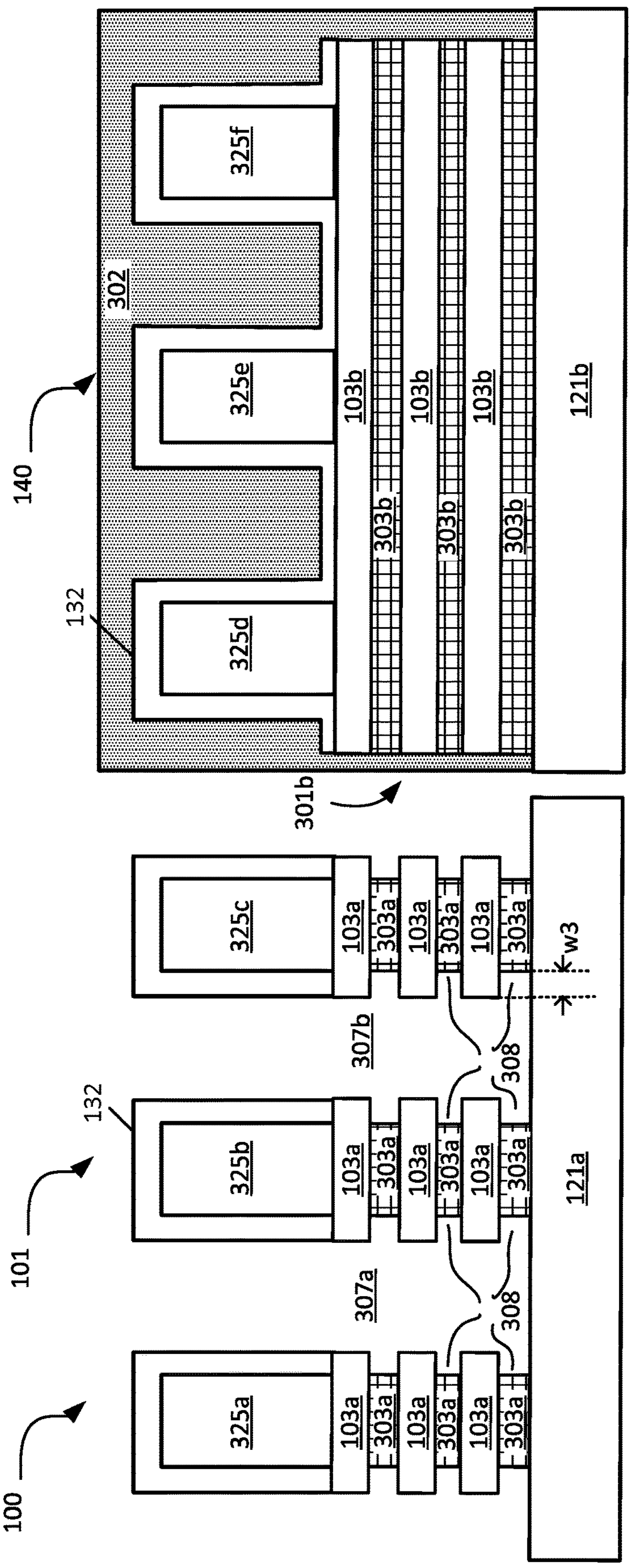

The method 200 then proceeds from 212 to 216, where end portions of the sacrificial materials 303*a* of the left device 101 are recessed through the source and drain trenches 307*a*, 307*b*, as illustrated in FIG. 3D. In an example, the sacrificial materials 303*a* are etch selective to the channel materials 103*a*, and hence, the channel materials 103*a* are not substantially recessed (or recessed at a slower rate) during process 216. An appropriate etch process may be employed in the process 216. In an example, recesses 308 are formed within the source and drain trenches 307*a*, 307*b*, due to the removal of the end portions of the sacrificial materials 303*a*, as illustrated in FIG. 3D. In an example, an inner sidewall of the recesses 308 may be aligned with a corresponding sidewall of one of the dummy gates 325*a*, 325*b*, 325*c*, as also illustrated in FIG. 3D. In another example, no such alignment may occur. As illustrated, a horizontal width of the recesses 308 is about w3, as illustrated in FIG. 3D, and as also discussed with respect to FIG. 1A.

In an example, as the fin 301*b* of the right device 140 is still covered by the mask 302, the process 216 doesn't affect the fin 301*b* of the right device 140. In another example, the mask 302 may be removed prior to, or during the process 216, and the layer 132 on the right fin 301*b* may continue to protect the sacrificial material 303*b* and/or the channel material 103*b* of the right fin 301*b* from being etched during the process 216.

Figure 3E:
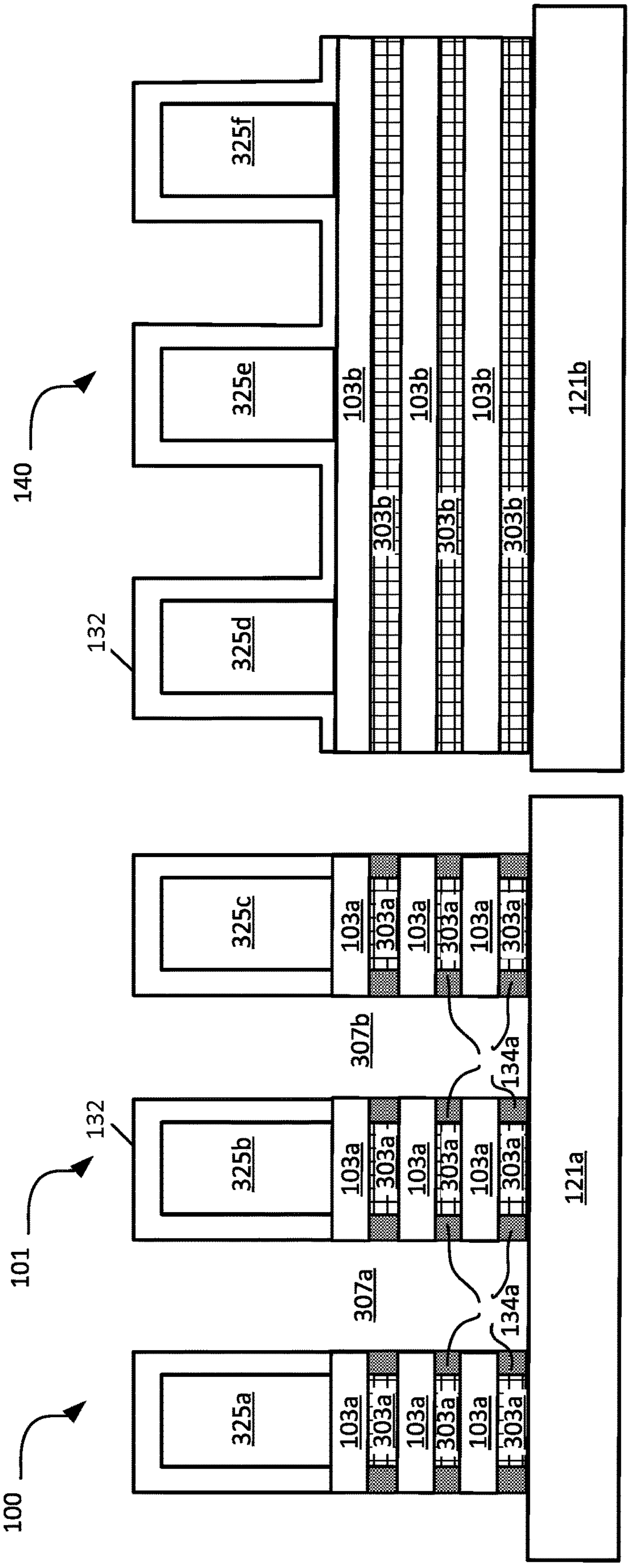

The method 200 then proceeds from 216 to 220, where mask 302 is removed (e.g., etched), as illustrated in FIG. 3D1. Note that although the mask 302 is removed in the process 220, the mask 302 could have been removed during an earlier process as well, e.g., between processes 212 and 216. Also, at 220, inner spacers 134*a* are formed within the recesses 308 of the left device 101, as illustrated in FIG. 3E. For example, dielectric material of the inner spacers 134*a* are deposited through the source and drain trenches 307*a*, 307*b* using an appropriate deposition technique, and then etched back (e.g., using an anisotropic or directional etch process), to form the inner spacers 134*a*. Due to the etch back of the inner spacers 134*a*, tips of the channel materials 103*a* are exposed through the inner spacers 134*a*, as illustrated in FIG. 3E.

Figure 3F:
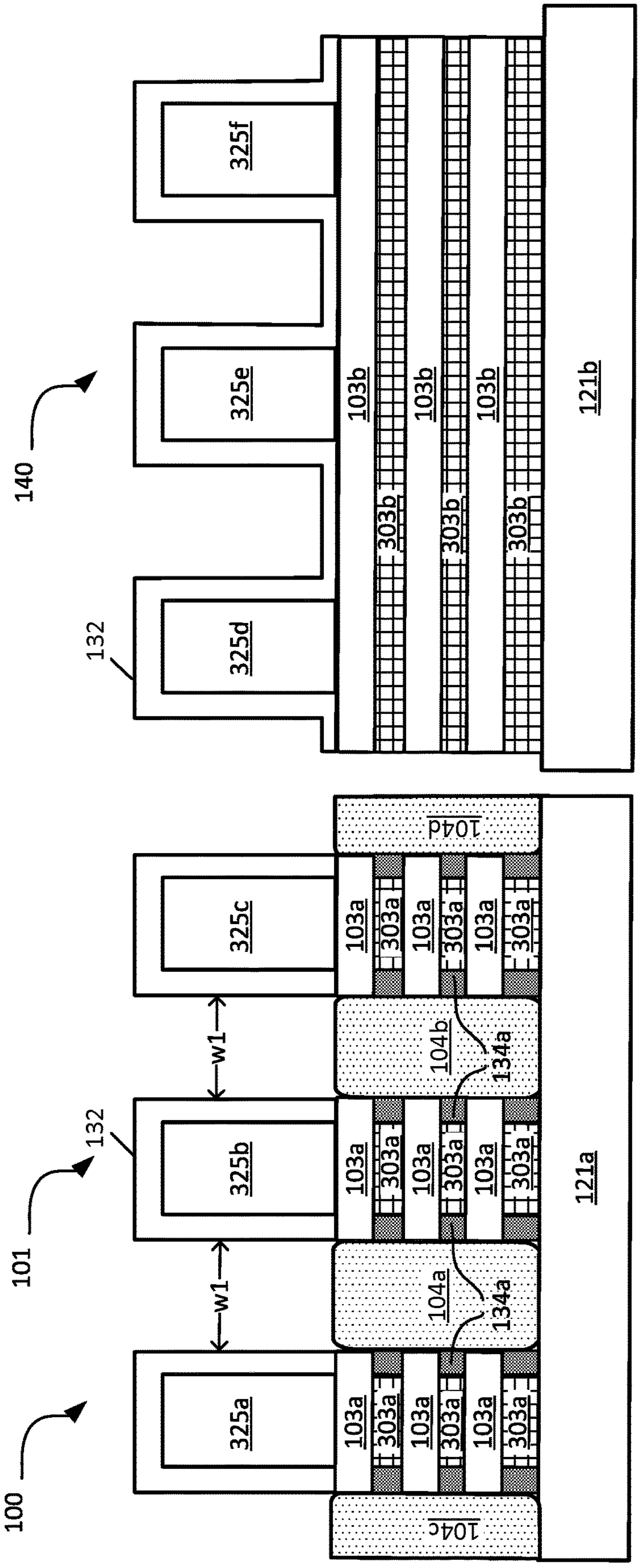

The method 200 then proceeds from 220 to 224, where the source and drain regions 104*a*, 104*b* of the left device 101 are formed, as illustrated in FIG. 3F. In an example, in the process 224, the source and drain regions 104*a*, 104*b* are epitaxially formed. Note that each of the source and drain trenches 307*a*, 307*b* had the width w1, which was discussed herein above with respect to FIG. 3A (and FIG. 1A). Thus, each of the source and drain regions 104*a*, 104*b* have the width w1 that is equal to a distance between two adjacent sidewalls of the layer 132, see FIGS. 3F and 3A.

Figure 3G:
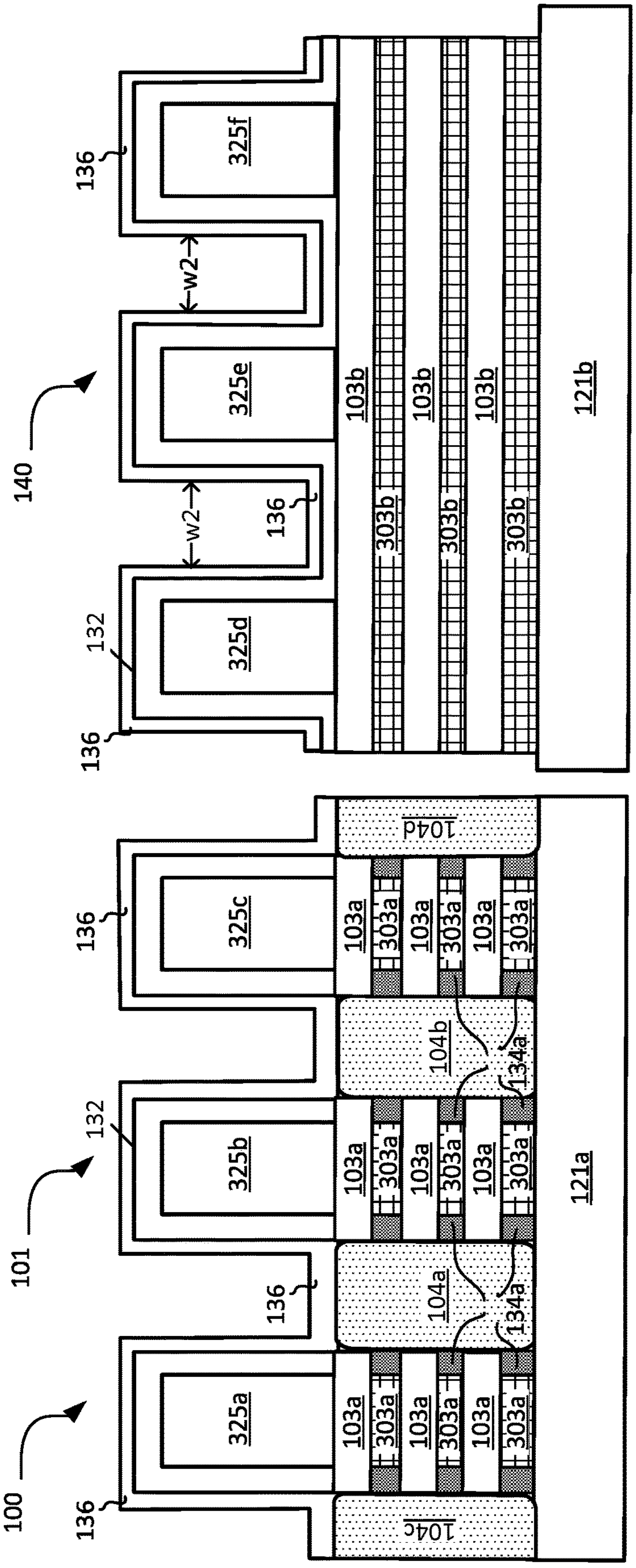

The method 200 then proceeds from 224 to 228, where the layer 136 is deposited on the resultant structure, as illustrated in FIG. 3G. For example, the layer 136 is blanket deposited to cover both devices 101, 140 using an appropriate deposition technique, such as CVD, PVD, ALD, VPE, MBE, or LPE, for example. In an example and as illustrated in FIG. 3G, the distance between two opposing sidewalls of the layer 136 is about w2. As will be seen herein below, the source and drain regions 106*a*, 106*b* of the right device 140 formed later will have this width w2.

Comparing width w1 of FIG. 3A and w2 of FIG. 3G, in an example, width w2 is less than w1 due to the additional layer 136 on the layer 132. Accordingly, in an example, width w2 of the source and drain regions 106*a*, 106*b* of the right device 140 may be less than width w1 of the source and drain regions 104*a*, 104*b* of the left device 101, e.g., as also discussed with respect to FIG. 1A.

However, in another example, layer 132 in FIG. 3G is less thick than the same layer 132 in FIG. 3A, e.g., as the structure 100 underdoes through various processes (e.g., including various etch processes) between FIGS. 3A and 3G. Accordingly, because layer 132 in FIG. 3G is thinner than the same layer 132 in FIG. 3A, in an example, the widths w1 and w2 may be substantially similar, e.g., 1 nm of each other.

Figure 3H:
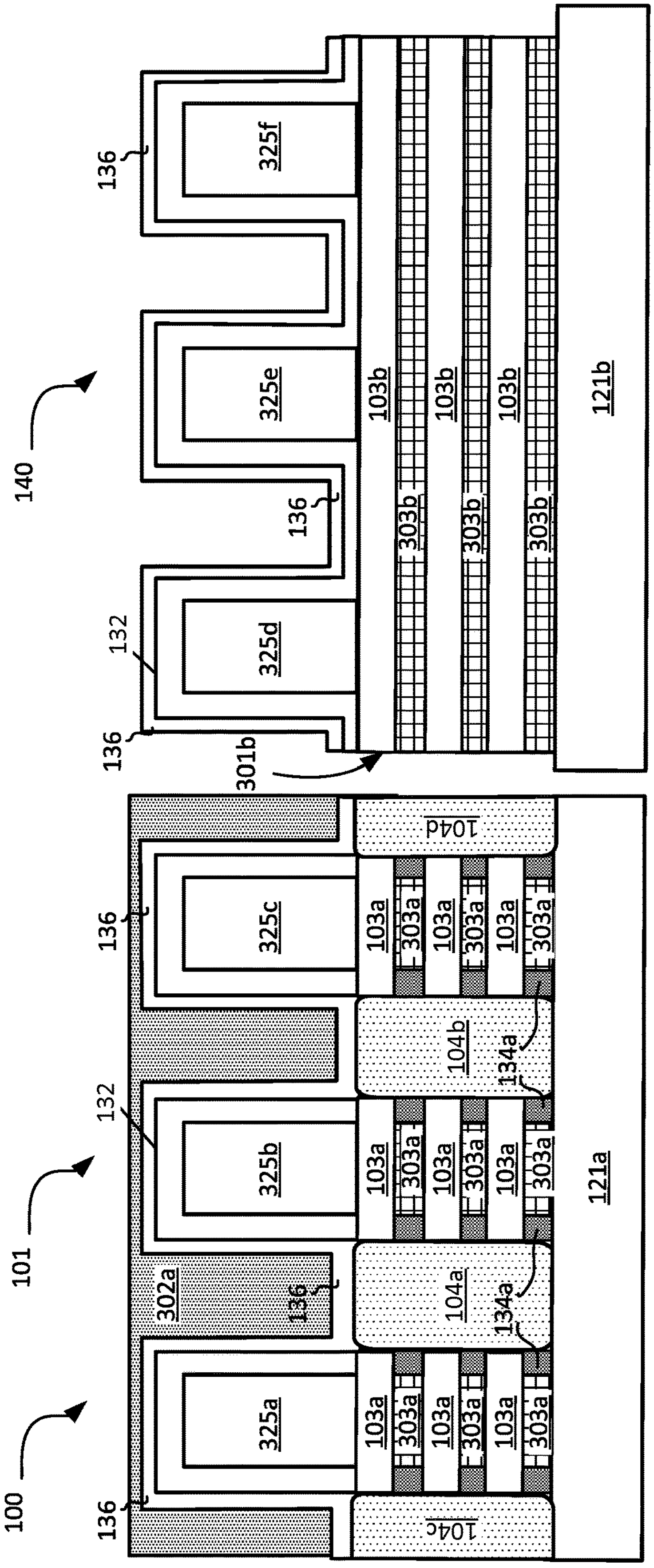

Also at 228, a mask 302*a* is patterned on the left device 101, as illustrated in FIG. 3H. In an example, the mask 302*a* is similar to the mask 302 discussed herein above.

Figure 3I:
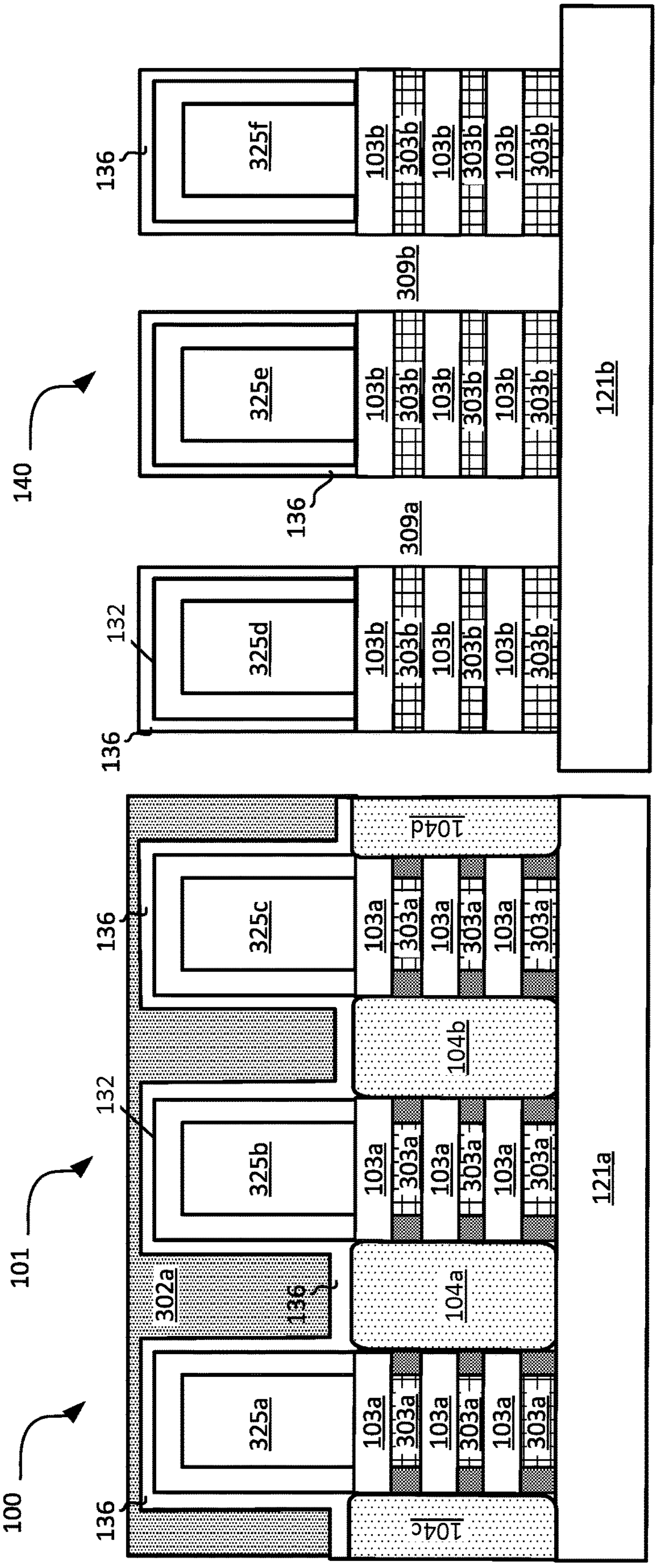

The method 200 then proceeds from 228 to 232, where the fin 301*b* of the right device 140 (e.g., which is not covered by the mask 302*a*) is patterned, to form source and drain trenches 309*a*, 309*b*, as illustrated in FIG. 3I. As illustrated, the mask 302*a* protects the left device 101 form being etched. This process 232 is at least in part similar to the process 212 discussed herein earlier.

Figure 3J:
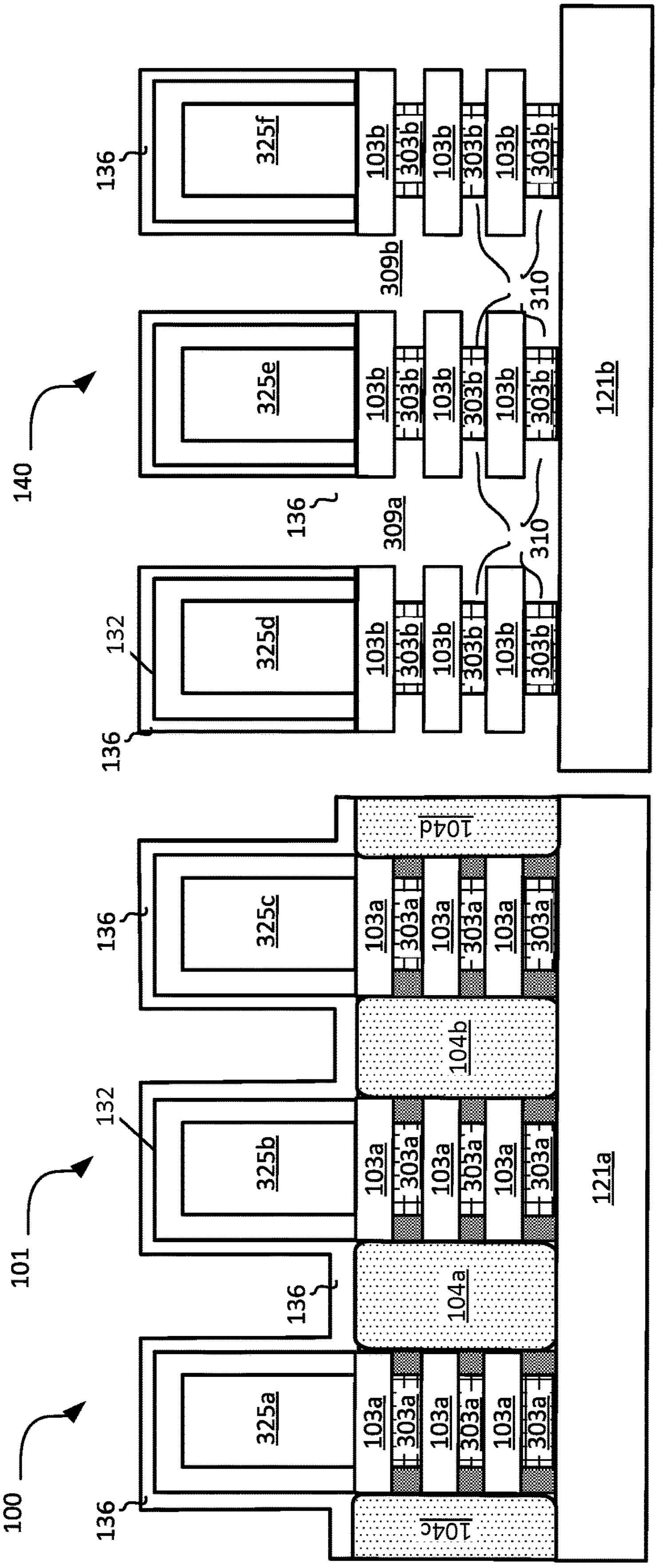

The method 200 then proceeds from 232 of FIG. 2A to 236 of FIG. 2B, where the mask 302*a* is removed (e.g., etched), and end portions of the sacrificial materials 303*b* of the right device 140 are recessed through the source and drain trenches 309*a*, 309*b*, to form recesses 310 within the source and drain trenches 309*a*, 309*b*, e.g., as illustrated in FIG. 3J. This process 236 is at least in part similar to the process 216 discussed herein earlier.

Figure 3K:
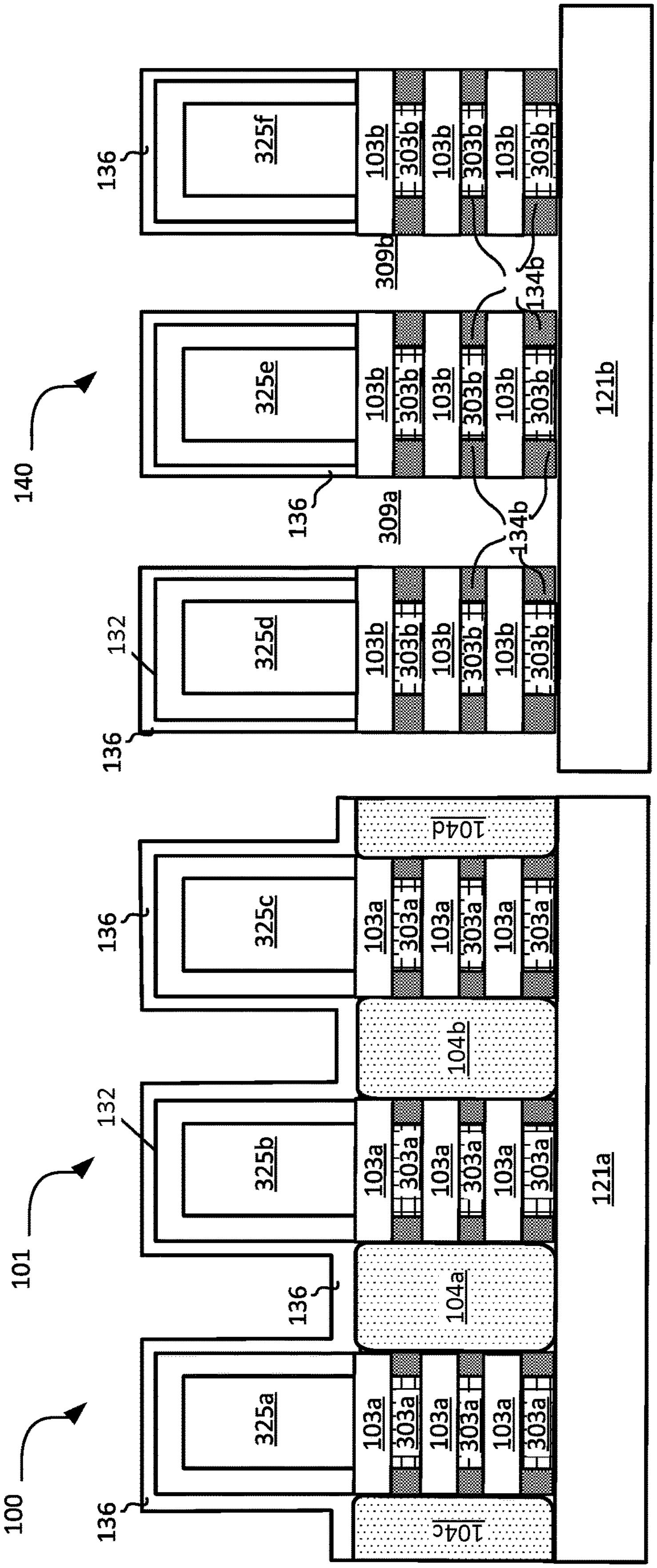

The method 200 then proceeds from 236 to 240, where inner spacers 134*b* are formed within the recesses 310 of the right device 140, as illustrated in FIG. 3K. This process 240 is at least in part similar to the process 220 discussed herein earlier.

Figure 3L:
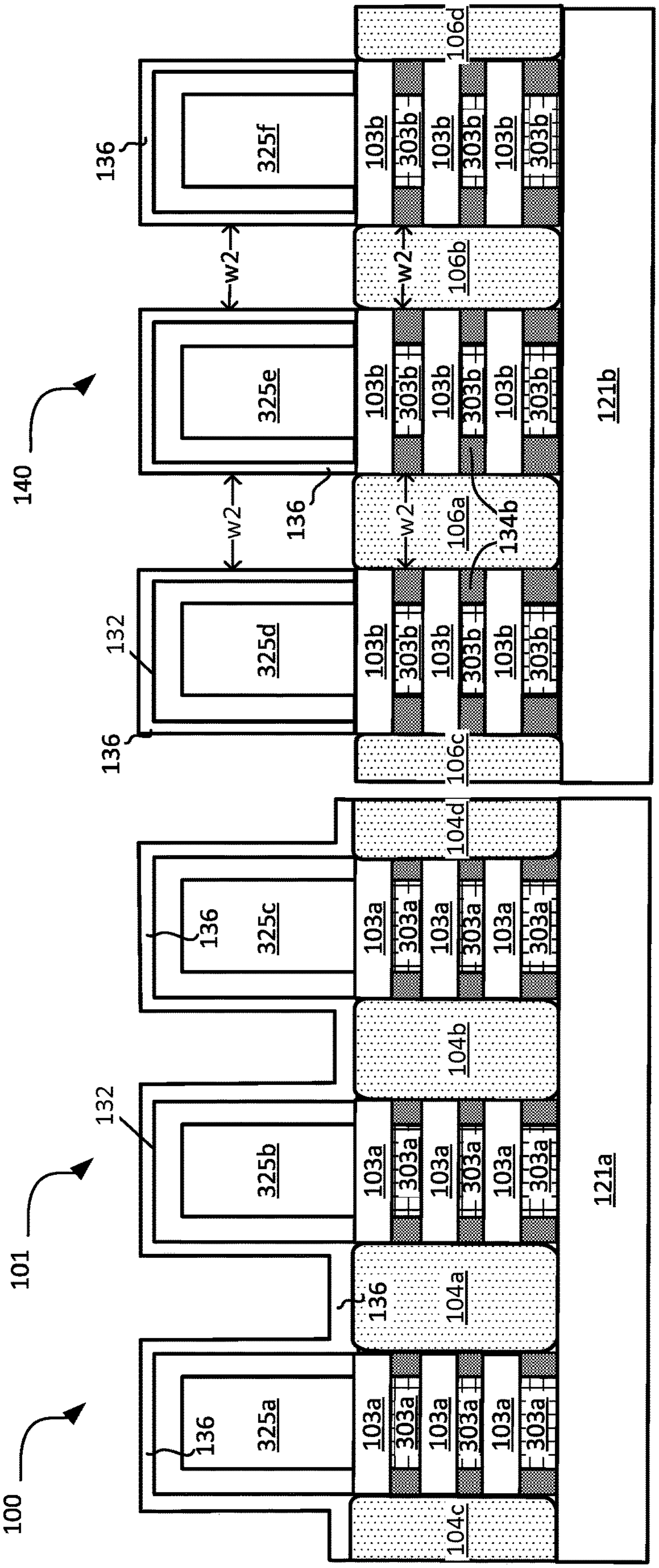

The method 200 then proceeds from 240 to 244, where source and drain regions 106*a*, 106*b* of the right device 140 are formed, as illustrated in FIG. 3L. This process 240 is at least in part similar to the process 224 discussed herein earlier.

Note that each of the source and drain trenches 309*a*, 309*b* had the width w2, which is discussed herein above with respect to FIG. 3G (and FIG. 1A). Thus, each of the source and drain regions 106*a*, 106*b* have the width w2 that is equal to a distance between two adjacent sidewalls of the layer 136, see FIGS. 3G and 3L. As discussed with respect to FIG. 3G, in an example, width w2 is less than width w1; whereas in other examples widths w1 and w2 may be substantially similar.

Figure 3M:
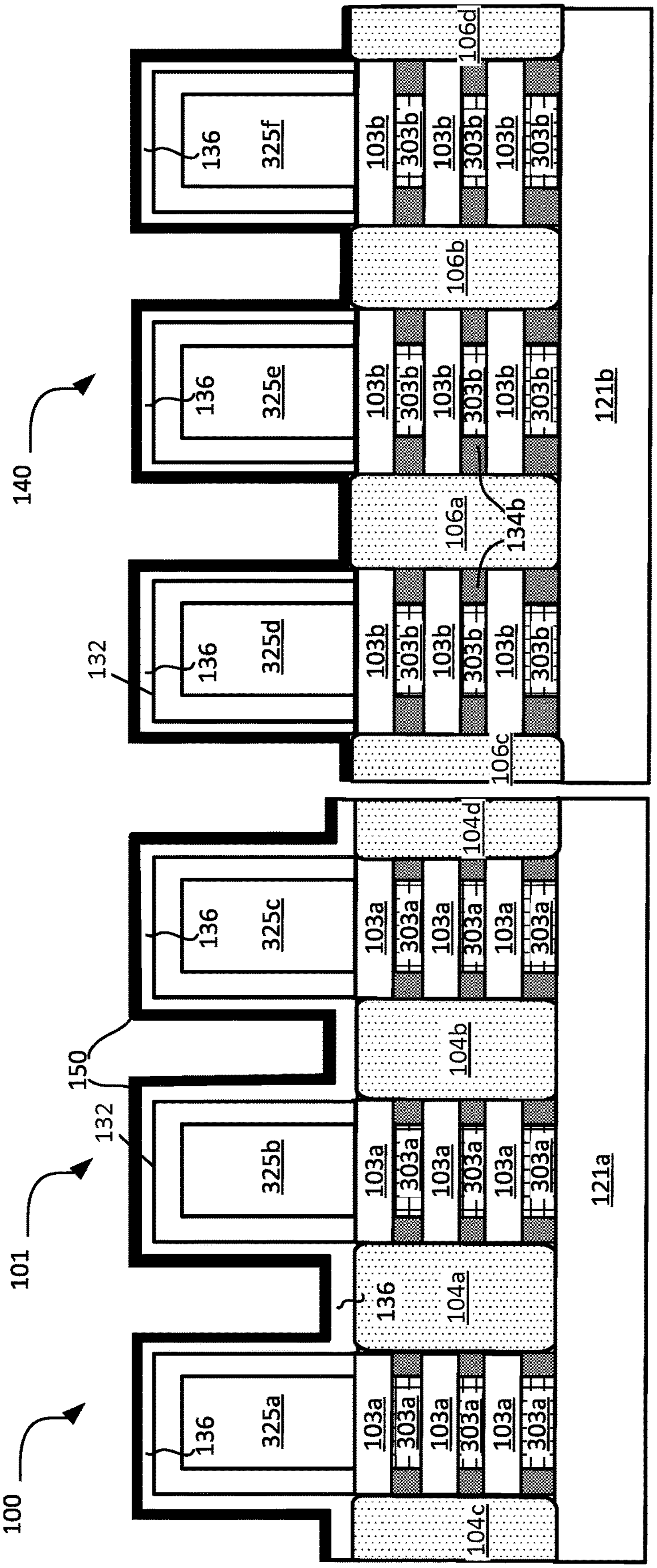

The method 200 then proceeds from 244 to 248, where layer 150 comprising dielectric material layer 150 is deposited (e.g., blanket deposited) over the structure 100, e.g., using an appropriate deposition technique, such as CVD, PVD, ALD, VPE, MBE, or LPE, for example, as illustrated in FIG. 3M. In an example, the layer 150 protect the epitaxially grown source and drain regions from subsequent interlayer dielectric (ILD) formation processes in source or drain trenches. For example, subsequent ILD formation processes may oxidize the source or drain regions, and the layer 150 of dielectric material prevents, or at least reduces such oxidation process.

Figure 3N:
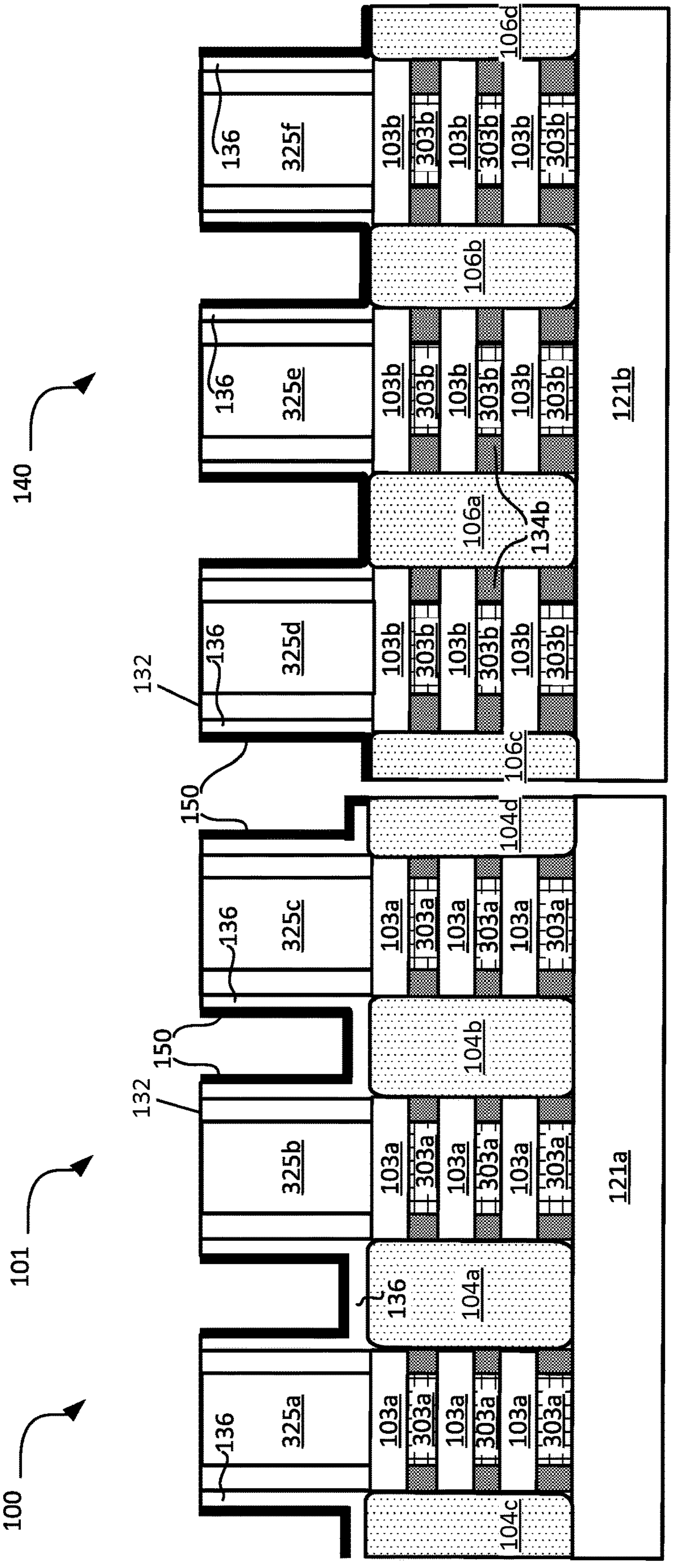
Figure 3O:
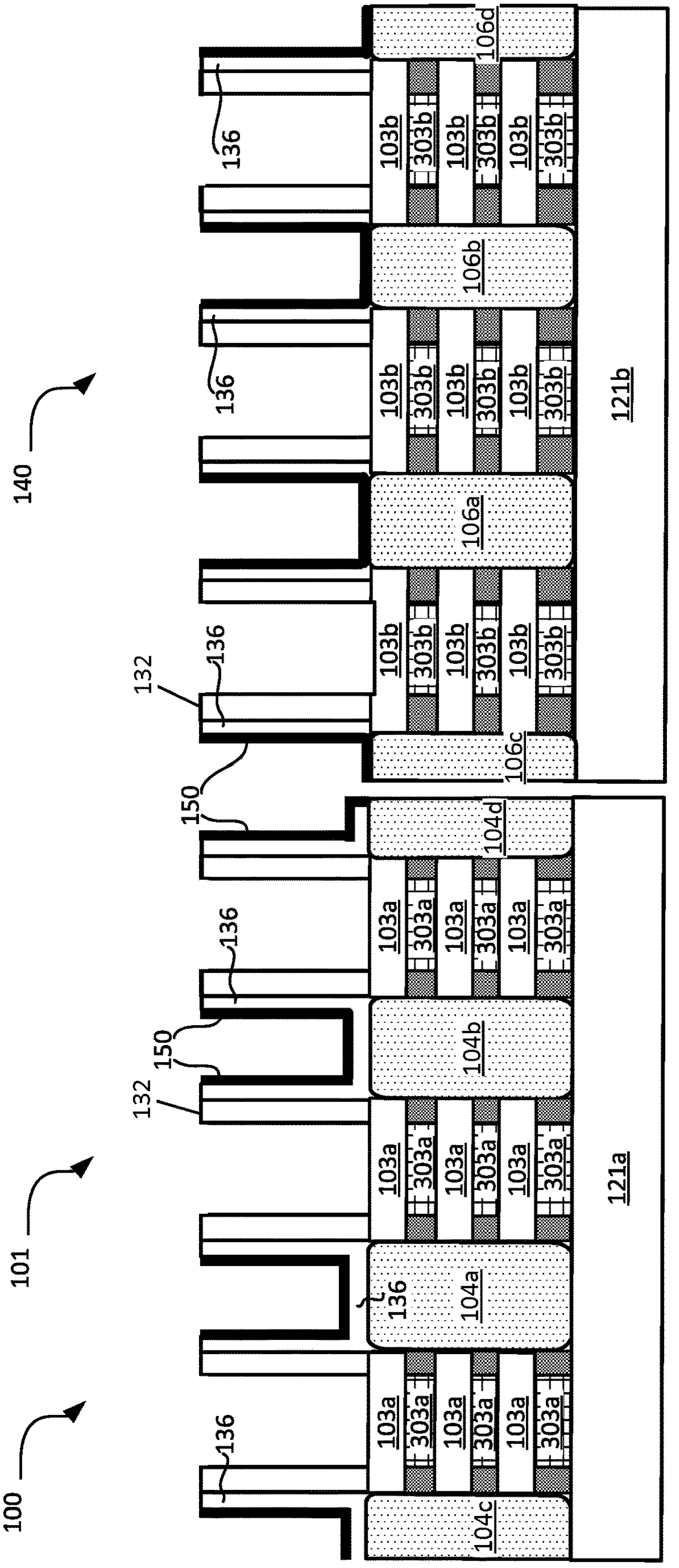

The method 200 then proceeds from 248 to 252, where for both devices 101, 140, top portions of the layers 150, 136, 132 are recessed, so as to expose the dummy gates 325, as illustrated in FIG. 3N. In an example, one or more appropriate etch processes may be employed for recessing the dielectric materials of the layers 150, 136, 132. In an example, prior to the process 252, an interlayer dielectric material (TLD) is deposited to encapsulate the structure, and the recessing of process 252 may also include recessing the top portion of the ILD, such that the dummy gates 325 are exposed.

Figure 3P:
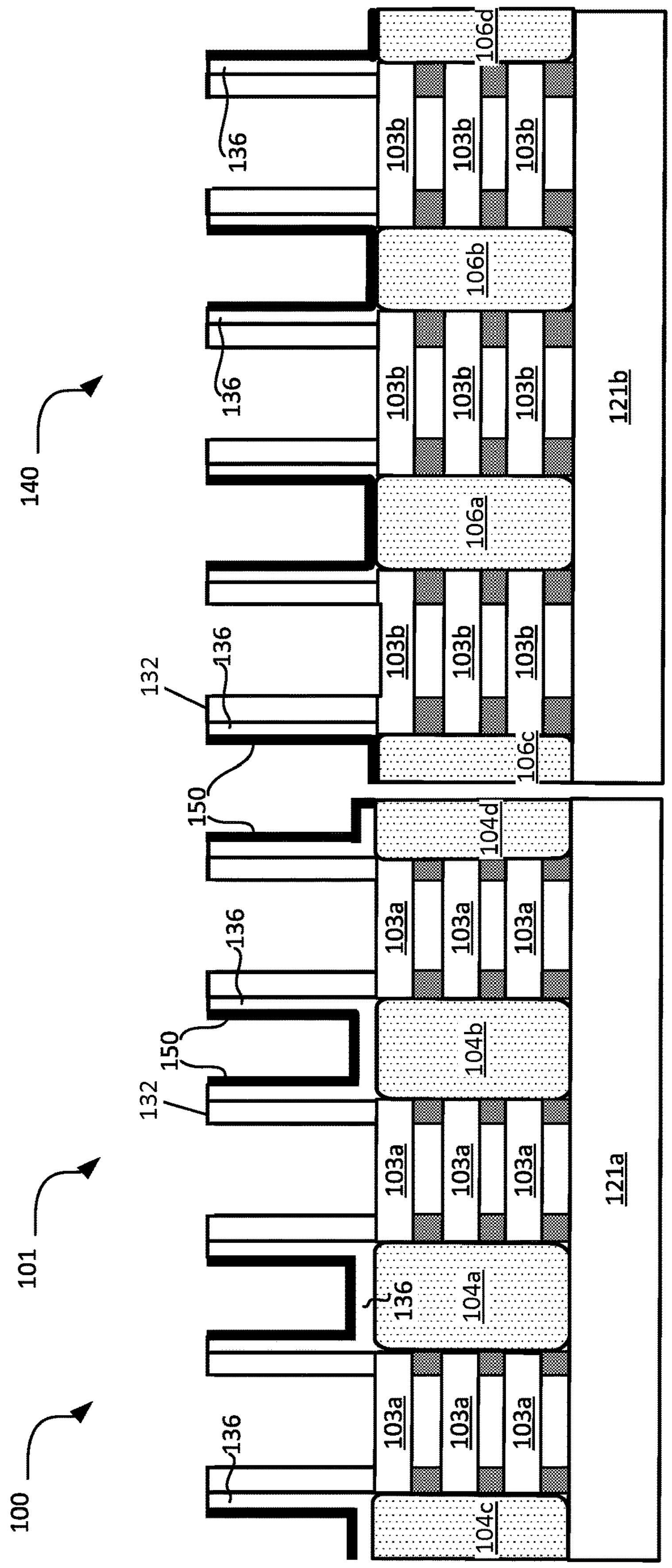

Furthermore, also at 252, the dummy gate material 325 are removed (see FIG. 3O) and the sacrificial materials 303 are selectively removed (e.g., without removing the channel materials 103, see FIG. 3P), to release the nanoribbons 103. For example, the dummy gate materials 325 (which comprises polysilicon, for example) are removed using an appropriate etch process, and the sacrificial materials 303 are removed using a selective etch process that does not substantially etch the channel materials 103. The channel materials 103 now form the nanoribbons 103 for the devices 101, 140, as illustrated in FIG. 3P.

Figure 3Q:
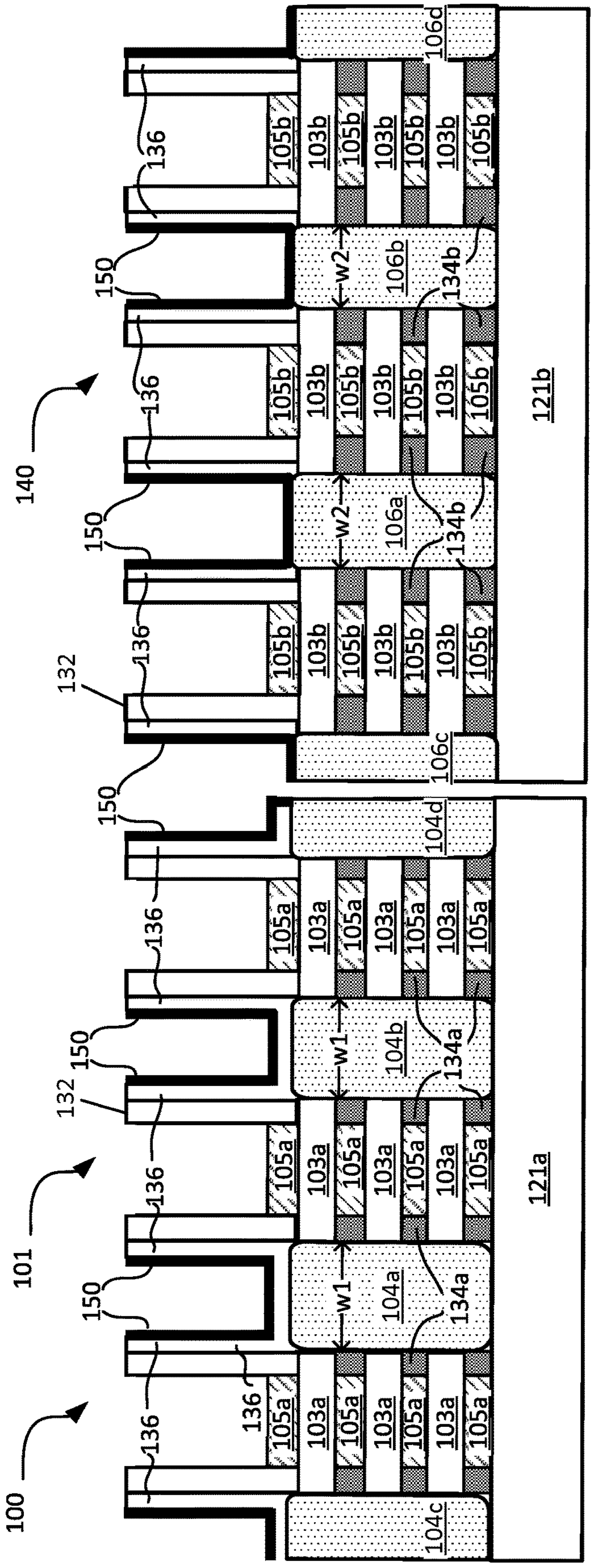

The method 200 then proceeds from 252 to 256, where final gate structures 122 for device 101 and final gate structures 172 for device 140 are formed, as illustrated in FIG. 3Q. For example, the final gate structures 122 for device 101 comprises gate electrode 105*a* and gate dielectric 120, and the final gate structures 172 for device 140 comprises gate electrode 105*b* and gate dielectric 120, e.g., see FIG. 1A where the gate structures 122 and 172 and gate dielectric 120 are labelled. The final gate structures 122, 172 are formed using appropriate techniques for forming final gate structures in GAA devices.

Figure 3R:
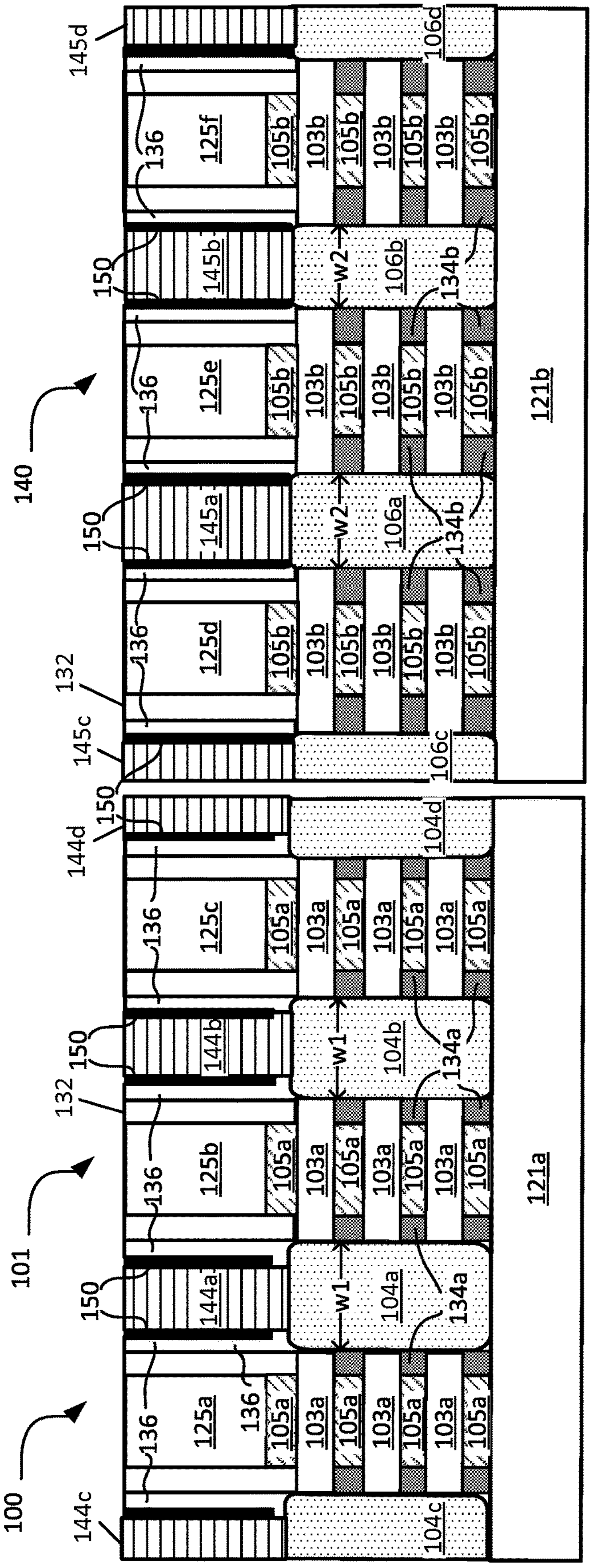

The method 200 then proceeds from 256 to 260, where gate contacts 125 and various source and drain contacts 144, 145 for devices 101, 140 are formed, as illustrated in FIG. 3R. The gate contacts and the source and drain contacts are formed using appropriate techniques for forming these contacts in GAA devices.

The method 200 then proceeds from 260 to 264, where a general integrated circuit (IC) is completed, as desired, in accordance with some embodiments. Such additional processing to complete an IC may include back-end or back-end-of-line (BEOL) processing to form one or more metallization layers, and/or to interconnect the transistor devices formed, for example. Any other suitable processing may be performed, as will be apparent in light of this disclosure.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
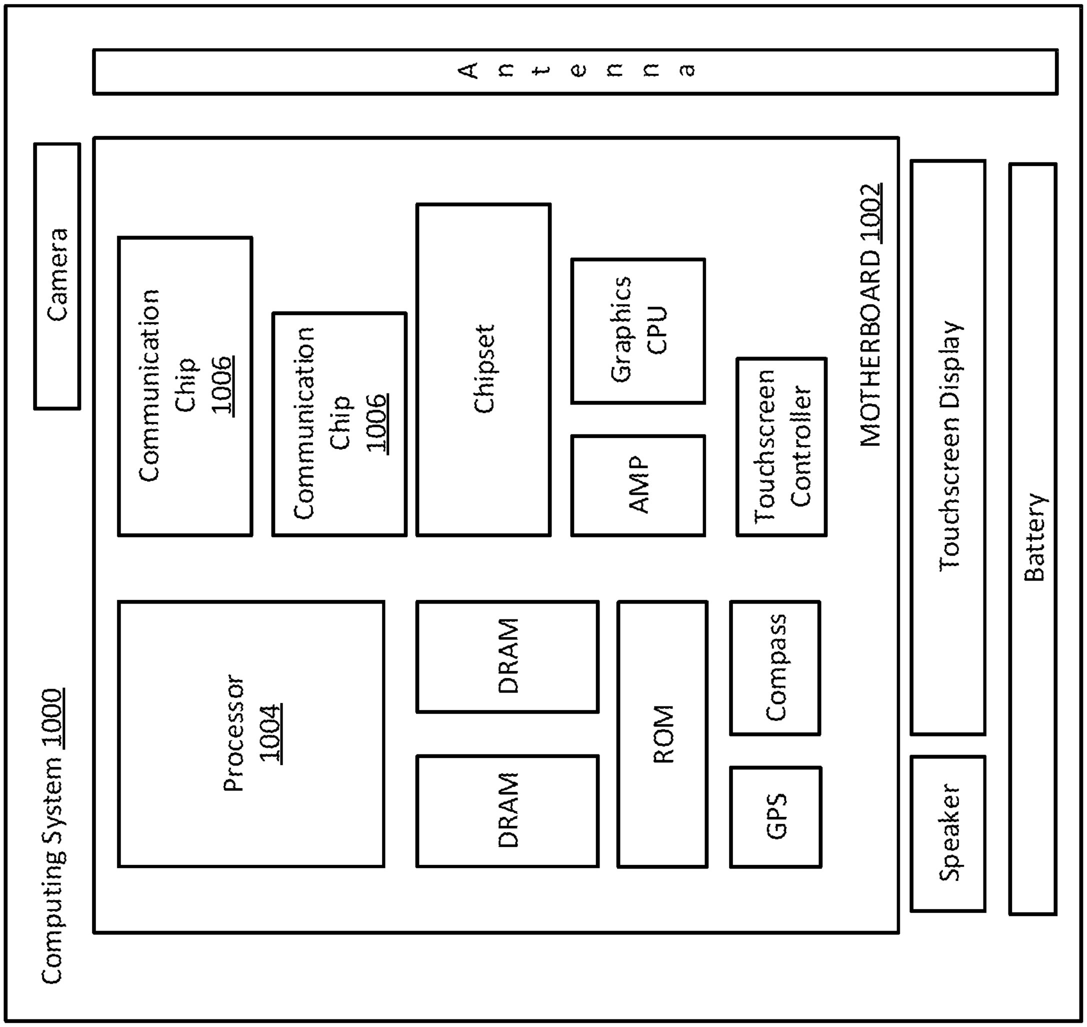
FIG. 4 illustrates a computing system implemented with integrated circuit structures formed using the techniques disclosed herein, in accordance with some embodiments of the present disclosure.

FIG. 4 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1. An integrated circuit structure, comprising: a first device comprising (i) a first source or drain region, (ii) a first body comprising semiconductor material laterally extending from the first source or drain region, (iii) a first gate structure wrapping around a section of the first body, and (v) a first inner spacer between the first source or drain region and the first gate structure; and a second device laterally adjacent to the first device, the second device comprising (i) a second source or drain region, (ii) a second body comprising semiconductor material laterally extending from the second source or drain region, (iii) a second gate structure wrapping around a section of the second body, and (v) a second inner spacer between the second source or drain region and the second gate structure, wherein the first source or drain region has a first width in a direction parallel to the first body, the second source or drain region has a second width in the direction parallel to the first body, the first inner spacer has a third width in the direction parallel to the first body, and the second inner spacer has a fourth width in the direction parallel to the first body, and wherein (i) the first width is different from the second width by at least 1 nm, and/or (ii) the third width is different from the fourth with by at least 1 nm.

Example 2. The integrated circuit structure of example 1, wherein (i) the first width is different from the second width by at least 1 nm, and (ii) the third width is different from the fourth with by at least 1 nm.

Example 3. The integrated circuit structure of any of examples 1-2, wherein: the first device comprises (i) a first layer comprising a first dielectric material and (ii) an adjacent second layer comprising a second dielectric material, with an interface between the first and second layers, wherein the first layer and the second layer are laterally between (i) a first gate contact that is coupled to the first gate structure and (ii) a first source or drain contact that is coupled to the first source or drain region; the second device comprises (i) a third layer comprising the first dielectric material and (ii) an adjacent fourth layer comprising the second dielectric material, with an interface between the third and fourth layers, wherein the third layer and the fourth layer are laterally between (i) a second gate contact that is coupled to the second gate structure and (ii) a second source or drain contact that is coupled to the second source or drain region; the first inner spacer is below the first layer and not below the second layer; and the second inner spacer is below the fourth layer.

Example 4. The integrated circuit structure of example 3, wherein the second inner spacer is also below the third layer.

Example 5. The integrated circuit structure of any of examples 3-4, wherein the first layer is in contact with the first gate contact, and the first layer is laterally between the first gate contact and the second layer.

Example 6. The integrated circuit structure of any of examples 3-5, wherein the third layer is in contact with the second gate contact, and the third layer is laterally between the second gate contact and the fourth layer.

Example 7. The integrated circuit structure of any of examples 3-6, wherein the first dielectric material and the second dielectric material are compositionally different.

Example 8. The integrated circuit structure of any of examples 3-6, wherein the first dielectric material and the second dielectric material are elementally the same.

Example 9. The integrated circuit structure of any of examples 3-8, wherein: the first device comprises a fifth layer comprising a third dielectric material that is between the second layer and the first source or drain contact; the second device comprises a sixth layer comprising the third dielectric material that is between the fourth layer and the second source or drain contact; the first inner spacer is not below the fifth layer; and the second inner spacer is not below the sixth layer.

Example 10. The integrated circuit structure of any of examples 3-9, wherein at least one or both of the second layer and the fourth layer is a discontinuous layer.

Example 11. The integrated circuit structure of any of examples 1-10, wherein (i) the first width is different from the second width by at least 2 nm, and/or (ii) the third width is different from the fourth width by at least 2 nm.

Example 12. The integrated circuit structure of any of examples 1-11, wherein each of the first body and the second body is a nanoribbon, or a nanowire, or a nanosheet.

Example 13. The integrated circuit structure of any of examples 1-12, wherein the first device comprises a plurality of bodies comprising semiconductor material laterally extending from the first source or drain region, the plurality of bodies including the first body.

Example 14. The integrated circuit structure of example 13, wherein the plurality of bodies is a vertical stack of nanoribbons, or nanowires, or nanosheets.

Example 15. The integrated circuit structure of any of examples 1-14, wherein the first device and the second device are arranged in a complementary metal oxide semiconductor (CMOS) architecture.

Example 16. The integrated circuit structure of any of examples 1-15, wherein the first device is one of a p-channel metal-oxide semiconductor (PMOS) device or a n-channel metal-oxide semiconductor (NMOS) device, and the second device is the other of the PMOS device or the NMOS device.

Example 17. An integrated circuit structure, comprising: a first device comprising (i) a first source or drain region and a corresponding first source or drain contact, (ii) a first gate structure and a corresponding first gate contact, (iii) a first layer comprising a first dielectric material and an adjacent second layer comprising a second dielectric material, wherein the first layer and the second layer are laterally between the first gate contact and the first source or drain contact, and (iv) a first inner spacer laterally between the first source or drain region and the first gate structure, wherein the first inner spacer is below the first layer and not below the second layer; and a second device comprising (i) a second source or drain region and a corresponding second source or drain contact, (ii) a second gate structure and a corresponding second gate contact, (iii) a third layer comprising the first dielectric material and an adjacent fourth layer comprising the second dielectric material, wherein the third layer and the fourth layer are laterally between the second gate contact and the second source or drain contact, and (iv) a second inner spacer laterally between the second source or drain region and the second gate structure, wherein the second inner spacer is below the fourth layer.

Example 18. The integrated circuit structure of example 17, wherein a first interface is between the first and second layers, and a second interface is between the third and fourth layers.

Example 19. The integrated circuit structure of any of examples 17-18, wherein the second inner spacer is also below the third layer.

Example 20. The integrated circuit structure of any of examples 17-19, wherein the first layer is in contact with the first gate contact, and the first layer is laterally between the first gate contact and the second layer.

Example 21. The integrated circuit structure of any of examples 17-20, wherein the third layer is in contact with the second gate contact, and the third layer is laterally between the second gate contact and the fourth layer.

Example 22. The integrated circuit structure of example 17-21, wherein the first dielectric material and the second dielectric material are compositionally different.

Example 23. The integrated circuit structure of any of examples 17-23, wherein: the first device comprises a fifth layer comprising a third dielectric material that is between the second layer and the first source or drain contact; the second device comprises a sixth layer comprising the third dielectric material that is between the fourth layer and the second source or drain contact; the first inner spacer is not below the fifth layer; and the second inner spacer is not below the sixth layer.

Example 24. The integrated circuit structure of example 17-23, wherein one or both of the second layer and the fourth layer is a discontinuous layer.

Example 25. The integrated circuit of example 17-24, wherein the second device is laterally separated from the first device by at most 400 nanometers.

Example 26. The integrated circuit structure of any of examples 17-25, wherein: the first device comprises a first body comprising semiconductor material laterally extending from the first source or drain region, wherein the first gate structure wraps around a section of the first body; and the second device comprises a second body comprising semiconductor material laterally extending from the second source or drain region, wherein the second gate structure wraps around a section of the second body.

Example 27. The integrated circuit structure of example 26, wherein the first body comprises a first nanoribbon, and the second body comprises a second nanoribbon.

Example 28. A method of forming laterally adjacent first and second devices, the method comprising: forming a first fin adjacent to a second fin, wherein each of the first and second fins comprises alternate layers of channel materials and sacrificial materials; patterning the first fin, to form a first source or drain trench adjacent to the first fin, without patterning the second fin; recessing end portion of the sacrificial materials of the first fin through the first source or drain trench, and forming a first inner spacer adjacent the first fin; forming a first source or drain region within the first source or drain trench; subsequent to forming the first source or drain region, patterning the second fin, to form a second source or drain trench adjacent to the second fin; recessing end portion of the sacrificial materials of the second fin through the second source or drain trench, and forming a second inner spacer adjacent the second fin; and forming a second source or drain region within the second source or drain trench.

Example 29. The method of example 28, further comprising: while patterning the first fin to form the first source or drain trench adjacent to the first fin, protecting the laterally adjacent second fin using a mask and refraining from forming any source or drain trench adjacent to the second fin.

Example 30. The method of any of examples 28-29, further comprising: subsequent to forming the first source or drain region and prior to patterning the second fin, depositing a layer of dielectric material above both the first and second fins, and a mask above the first fin, wherein the mask and/or the layer of dielectric material protects the first fin from being further patterned, while patterning the second fin.

Example 31. The method of example 30, wherein the second inner spacer is formed at least in part below the layer of dielectric material, and wherein no portion of the first inner spacer is below the layer of dielectric material.

Example 32. An integrated circuit structure, comprising: a first device comprising (i) a first source or drain region, (ii) a first body comprising semiconductor material laterally extending from the first source or drain region, (iii) a first layer comprising a first dielectric material on a sidewall of the first source or drain region, and (iv) a second layer comprising a second dielectric material on the first layer;

and a second device comprising (i) a second source or drain region, (ii) a second body comprising semiconductor material laterally extending from the second source or drain region, (iii) a third layer comprising the second dielectric material on a sidewall of the second source or drain region, wherein the second device lacks the first dielectric material on the sidewall of the second source or drain region.

Example 33. The integrated circuit structure of example 32, wherein the first layer is a continuous layer between the first source or drain region and the second layer.

Example 34. The integrated circuit structure of example 32, wherein the first layer comprises discontinuous remnants of the first dielectric material that are between the first source or drain region and the second layer.

Example 35. The integrated circuit structure of any of examples 32-24, wherein an interface is between the first layer and the second layer.

Example 36. The integrated circuit structure of any of examples 32-35, wherein a bottom surface of the first source or drain region is at least in part on a first horizontal plane, wherein a bottom surface of the second source or drain region is at least in part on a second horizontal plane, and wherein the second horizontal plane is vertically lower or higher than the first horizontal plane by at least 1 nm.

Example 37. The integrated circuit structure of example 36, wherein the second horizontal plane is vertically lower or higher than the first horizontal plane by at least 2 nm.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:

a first device comprising (i) a first source or drain region, (ii) a first body comprising semiconductor material laterally extending from the first source or drain region, (iii) a first gate structure wrapping around a section of the first body, (v) a first inner spacer between the first source or drain region and the first gate structure, (vi) a first layer comprising a first dielectric material, and (vii) a second layer comprising a second dielectric material adjacent to and directly on the first layer, wherein the first layer and the second layer are laterally between a first gate contact that is coupled to the first gate structure and a first source or drain contact that is coupled to the first source or drain region; and a second device laterally adjacent to the first device, the second device comprising (i) a second source or drain region, (ii) a second body comprising semiconductor material laterally extending from the second source or drain region, (iii) a second gate structure wrapping around a section of the second body, (v) a second inner spacer between the second source or drain region and the second gate structure, (vi) a third layer comprising the first dielectric material, and (vii) a fourth layer comprising the second dielectric material adjacent to and directly on the third layer, wherein the third layer and the fourth layer are laterally between a second gate contact that is coupled to the second gate structure and a second source or drain contact that is coupled to the second source or drain region, wherein the first source or drain region has a first width in a direction parallel to the first body, the second source or drain region has a second width in the direction parallel to the first body, the first inner spacer has a third width in the direction parallel to the first body, and the second inner spacer has a fourth width in the direction parallel to the first body, wherein (i) the first width is different from the second width by at least 1 nm, and/or (ii) the third width is different from the fourth with by at least 1 nm, and wherein the first inner spacer is aligned below the first layer and is not aligned below the second layer, and wherein the second inner spacer is aligned below both the third layer and the fourth layer.

2. The integrated circuit structure of claim 1, wherein (i) the first width is different from the second width by at least 1 nm, and (ii) the third width is different from the fourth with by at least 1 nm.

3. The integrated circuit structure of claim 1, wherein the first layer is in contact with the first gate contact, and the first layer is laterally between the first gate contact and the second layer.

4. The integrated circuit structure of claim 1, wherein the third layer is in contact with the second gate contact, and the third layer is laterally between the second gate contact and the fourth layer.

5. The integrated circuit structure of claim 1, wherein the first dielectric material and the second dielectric material are compositionally different.

6. The integrated circuit structure of claim 1, wherein the first dielectric material and the second dielectric material are elementally the same.

7. The integrated circuit structure of claim 1, wherein:

the first device comprises a fifth layer comprising a third dielectric material that is between the second layer and the first source or drain contact;

the second device comprises a sixth layer comprising the third dielectric material that is between the fourth layer and the second source or drain contact;

the first inner spacer is not aligned below the fifth layer; and the second inner spacer is not aligned below the sixth layer.

8. The integrated circuit structure of claim 1, wherein at least one or both of the second layer and the fourth layer is a discontinuous layer.

9. The integrated circuit structure of claim 1, wherein (i) the first width is different from the second width by at least 2 nm, and/or (ii) the third width is different from the fourth width by at least 2 nm.

10. The integrated circuit structure of claim 1, wherein each of the first body and the second body is a nanoribbon, or a nanowire, or a nanosheet.

11. The integrated circuit structure of claim 1, wherein the first device is one of a p-channel metal-oxide semiconductor (PMOS) device or a n-channel metal-oxide semiconductor (NMOS) device, and the second device is the other of the PMOS device or the NMOS device.

12. The integrated circuit structure of claim 1, wherein a bottom surface of the first source or drain region is at least in part on a first horizontal plane, wherein a bottom surface of the second source or drain region is at least in part on a second horizontal plane, and wherein the second horizontal plane is vertically lower or higher than the first horizontal plane by at least 1 nm.

13. An integrated circuit structure, comprising:

a first device comprising (i) a first source or drain region and a corresponding first source or drain contact, (ii) a first gate structure and a corresponding first gate contact, (iii) a first layer comprising a first dielectric material and an adjacent second layer comprising a second dielectric material, wherein the first layer and the second layer are laterally between the first gate contact and the first source or drain contact, and (iv) a first inner spacer laterally between the first source or drain region and the first gate structure, wherein the first inner spacer is aligned below the first layer and is not aligned below the second layer; and a second device comprising (i) a second source or drain region and a corresponding second source or drain contact, (ii) a second gate structure and a corresponding second gate contact, (iii) a third layer comprising the first dielectric material and an adjacent fourth layer comprising the second dielectric material, wherein the third layer and the fourth layer are laterally between the second gate contact and the second source or drain contact, and (iv) a second inner spacer laterally between the second source or drain region and the second gate structure, wherein the second inner spacer is aligned below both the third layer and the fourth layer.

14. The integrated circuit structure of claim 13, wherein a first interface is between the first and second layers, and a second interface is between the third and fourth layers.

15. The integrated circuit structure of claim 13, wherein the first layer is in contact with the first gate contact, and the first layer is laterally between the first gate contact and the second layer.

16. The integrated circuit structure of claim 13, wherein the third layer is in contact with the second gate contact, and the third layer is laterally between the second gate contact and the fourth layer.

17. The integrated circuit of claim 13, wherein the second device is laterally separated from the first device by at most 400 nanometers.

18. The integrated circuit structure of claim 13, wherein a bottom surface of the first source or drain region is at least in part on a first horizontal plane, wherein a bottom surface of the second source or drain region is at least in part on a second horizontal plane, and wherein the second horizontal plane is vertically lower or higher than the first horizontal plane by at least 1 nm.

19. The integrated circuit structure of claim 13, wherein:

the first device comprises a fifth layer comprising a third dielectric material that is between the second layer and the first source or drain contact;

the second device comprises a sixth layer comprising the third dielectric material that is between the fourth layer and the second source or drain contact;

the first inner spacer is not aligned below the fifth layer; and the second inner spacer is not aligned below the sixth layer.

20. An integrated circuit structure, comprising:

a first device comprising (i) a first source or drain region, (ii) a first body comprising semiconductor material laterally extending from the first source or drain region, (iii) a first layer comprising a first dielectric material on a sidewall of the first source or drain region, and (iv) a second layer comprising a second dielectric material on the first layer; and a second device comprising (i) a second source or drain region, (ii) a second body comprising semiconductor material laterally extending from the second source or drain region, (iii) a third layer comprising the second dielectric material on a sidewall of the second source or drain region, wherein the second device lacks the first dielectric material on the sidewall of the second source or drain region, and wherein the first layer comprises discontinuous remnants of the first dielectric material that are between the first source or drain region and the second layer.

21. The integrated circuit structure of claim 20, wherein a bottom surface of the first source or drain region is at least in part on a first horizontal plane, wherein a bottom surface of the second source or drain region is at least in part on a second horizontal plane, and wherein the second horizontal plane is vertically lower or higher than the first horizontal plane by at least 1 nm.

22. The integrated circuit structure of claim 20, further comprising a dielectric fill extending between the second layer and the third layer.

23. The integrated circuit structure of claim 20, wherein the first device is one of a p-channel metal-oxide semiconductor (PMOS) device or a n-channel metal-oxide semiconductor (NMOS) device, and the second device is the other of the PMOS device or the NMOS device.

* * * * *